US010305281B2

(12) United States Patent
Kobayashi et al.

(10) Patent No.: US 10,305,281 B2
(45) Date of Patent: May 28, 2019

(54) SEMICONDUCTOR DEVICE

(71) Applicant: KABUSHIKI KAISHA TOSHIBA, Tokyo (JP)

(72) Inventors: Hiroyuki Kobayashi, Kanagawa (JP); Toshiya Mitomo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 237 days.

(21) Appl. No.: 15/438,483

(22) Filed: Feb. 21, 2017

(65) Prior Publication Data

US 2018/0076620 A1 Mar. 15, 2018

(30) Foreign Application Priority Data

Sep. 9, 2016 (JP) .................................. 2016-176683

(51) Int. Cl.
| | | |
|---|---|---|
| *H02J 3/00* | (2006.01) | |
| *H02J 3/02* | (2006.01) | |
| *H02J 3/34* | (2006.01) | |
| *H03K 3/356* | (2006.01) | |
| *H03K 5/15* | (2006.01) | |
| *H04B 1/3888* | (2015.01) | |
| *H04B 1/38* | (2015.01) | |
| *H04B 1/3827* | (2015.01) | |

(52) U.S. Cl.
CPC ............... *H02J 3/02* (2013.01); *H02J 3/005* (2013.01); *H02J 3/34* (2013.01); *H03K 3/356113* (2013.01); *H03K 5/15* (2013.01); *H04B 1/3888* (2013.01); *H04B 1/38* (2013.01); *H04B 2001/3855* (2013.01); *H04B 2001/3861* (2013.01)

(58) Field of Classification Search
None
See application file for complete search history.

(56) References Cited

U.S. PATENT DOCUMENTS

2011/0057705 A1* 3/2011 Tahata ................ H01L 27/0928
  327/328
2015/0179249 A1* 6/2015 Park .................. G11C 11/40615
  365/207

FOREIGN PATENT DOCUMENTS

| JP | H02117221 A | 5/1990 |
| JP | 3347223 B2 | 11/2002 |
| JP | 4627033 B2 | 2/2011 |

* cited by examiner

*Primary Examiner* — Jared Fureman
*Assistant Examiner* — Aqeel H Bukhari
(74) *Attorney, Agent, or Firm* — Kim & Stewart LLP

(57) ABSTRACT

A semiconductor device includes a first circuit unit, comprising a first buffer, a second buffer, and a first processing unit, connected to a first power supply system, and a second circuit unit, comprising a third buffer, connected to a second power supply system different from the first power supply system. The semiconductor device includes a first oscillation signal generating circuit connected to the first power supply system, and a second oscillation signal generating circuit connected to the second power supply system. A first oscillation signal generated by the first oscillation signal generating circuit is input to the first buffer. A second oscillation signal generated by the second oscillation signal generating circuit is input to the second buffer through the third buffer. The first buffer selectively outputs the input first oscillation signal and the second buffer selectively outputs the input second oscillation signal based on a value of a control signal.

20 Claims, 17 Drawing Sheets

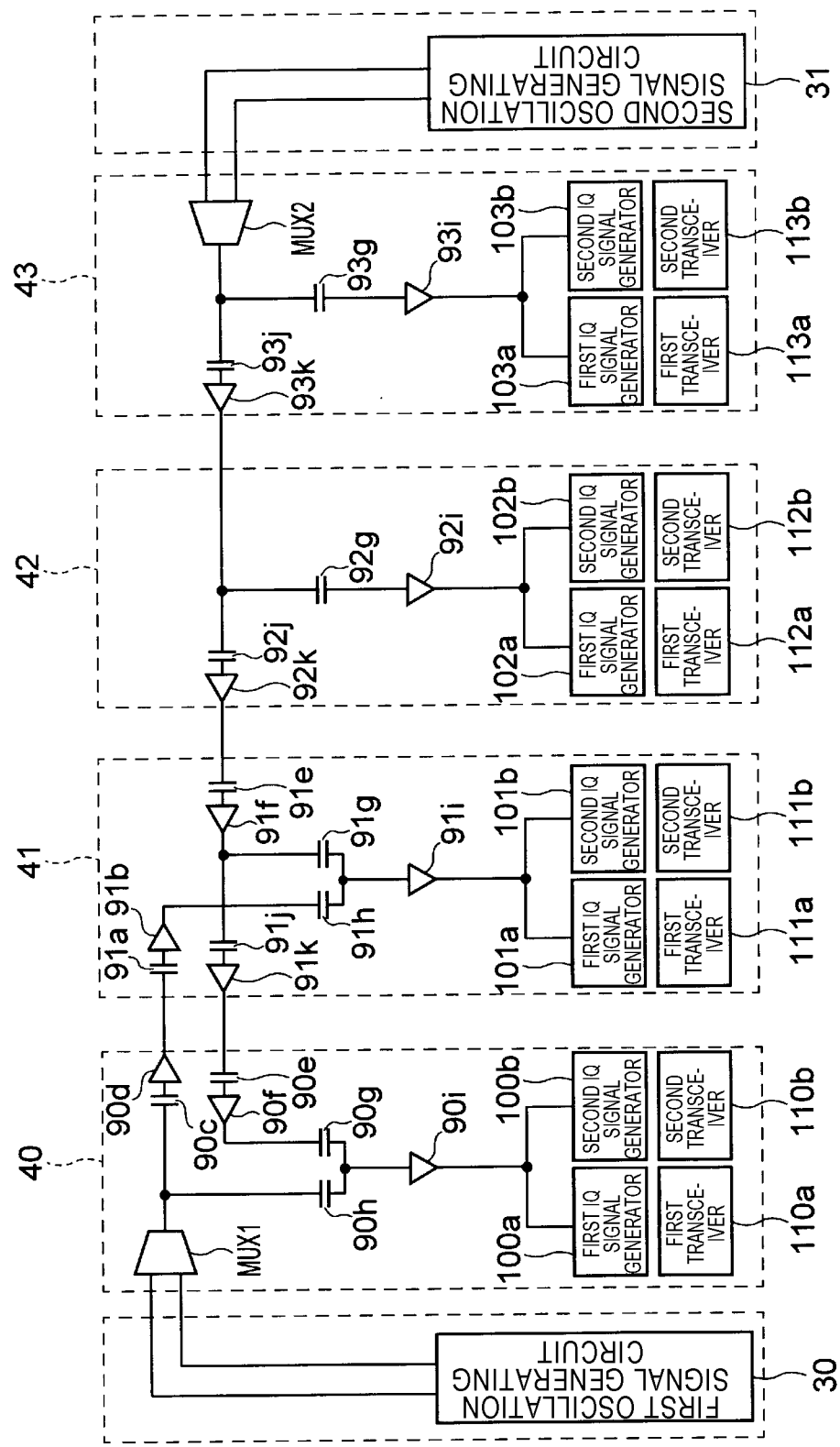

SEMICONDUCTOR DEVICE

CROSS-REFERENCE TO RELATED APPLICATION

This application is based upon and claims the benefit of priority from Japanese Patent Application No. 2016-176683, filed Sep. 9, 2016, the entire contents of which are incorporated herein by reference.

FIELD

Embodiments described herein relate generally to a semiconductor device.

BACKGROUND

For wireless communication, as a communication standard for both the transmitting side and the receiving side to communicate using a plurality of channels, a multiple input and multiple output (MIMO) protocol is proposed. Further, research and development for the practical use of multi-user MIMO acquired by partially making the MIMO into multi-users has been in active progress.

In order to implement this communication environment with a semiconductor device, two oscillation signals having different frequencies need to be supplied to an IQ signal generator generating an IQ modulation signal required by a transmitter or receiver. However, when the transmission paths of these two oscillation signals are established in parallel, a problem such as crosstalk can occur between the transmission paths.

Further, a change-over switch needs to be provided in a plurality of provided IQ signal generators in order to switch and supply the two oscillation signals to the transmitters and receivers, but problems such as crosstalk occurs between change-over switches which are close to each other.

DESCRIPTION OF THE DRAWINGS

FIG. 17 is a diagram illustrating another modification of the semiconductor device according to the second embodiment and a diagram corresponding to FIG. 12.

DETAILED DESCRIPTION

Figure 1:
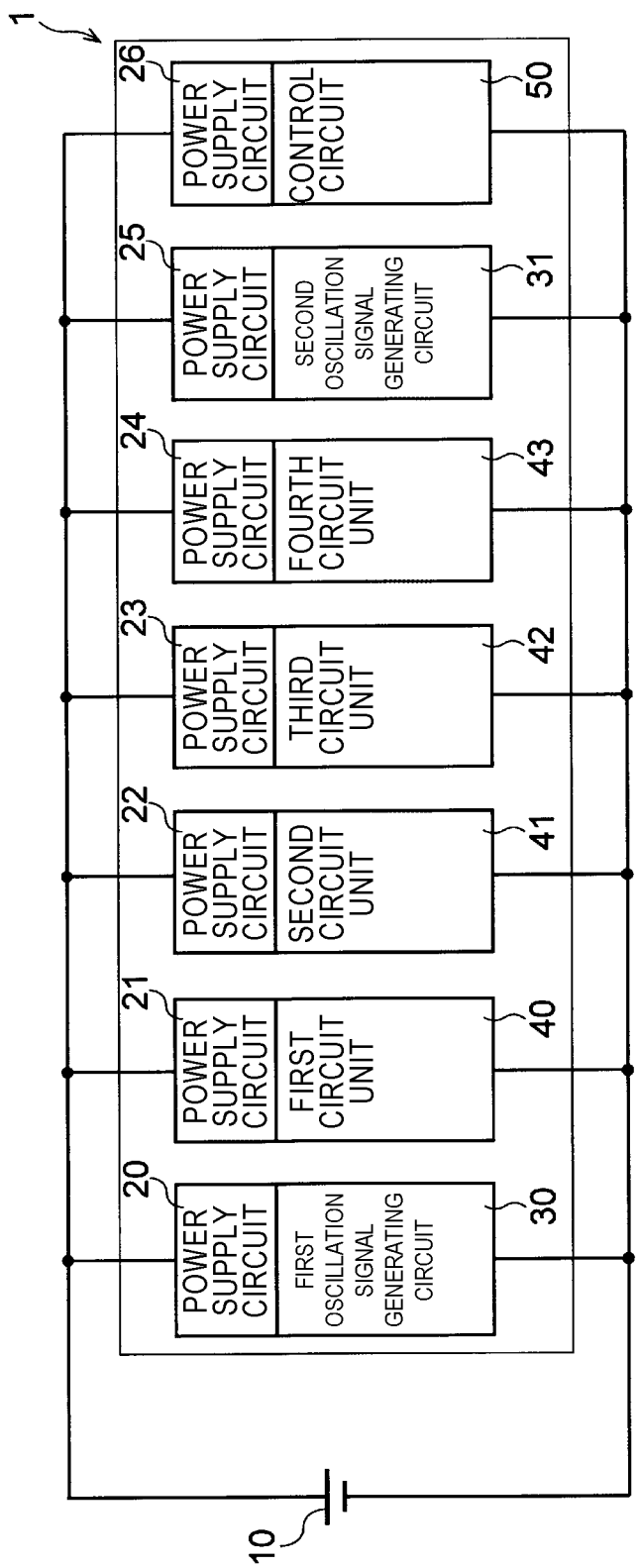
FIG. 1 is a layout diagram for illustrating a power supply system of a semiconductor device according to a first embodiment.

According to an embodiment, there is provided a semiconductor device which suppresses an influence of crosstalk between oscillation signals having different frequencies.

In general, according to an embodiment, a semiconductor device includes a first circuit unit, comprising a first buffer, a second buffer, and a first processing unit, connected to a first power supply system, and a second circuit unit, comprising a third buffer, connected to a second power supply system different from the first power supply system. The semiconductor device further includes a first oscillation signal generating circuit connected to the first power supply system, and a second oscillation signal generating circuit connected to the second power supply system. A first oscillation signal generated by the first oscillation signal generating circuit is input to the first buffer. A second oscillation signal generated by the second oscillation signal generating circuit is input to the second buffer through the third buffer. The first buffer selectively outputs the input first oscillation signal and the second buffer selectively outputs the input second oscillation signal based on a value of a control signal.

Hereinafter, a semiconductor device according to an embodiment will be described with reference to the drawings. In the following description, the same reference numerals refer to components having substantially the same function and configuration, and the components will be repeatedly described only when needed.

First Embodiment

FIG. 1 is a layout diagram illustrating a power supply system in a semiconductor device 1 according to an embodiment. As illustrated in FIG. 1, the semiconductor device 1 according to the embodiment includes a power supply system having a plurality of power supply circuits. In detail, the semiconductor device 1 includes power supply circuits 20 to 26 which receive power from a power supply 10, a first oscillation signal generating circuit 30 that receives power from the power supply circuit 20, first to fourth circuit units 40 to 43, each of which receives power from one of the power supply circuits 21 to 24, a second oscillation signal generating circuit 31 that receives power from the power supply circuit 25, and a control circuit 50 that receives power from the power supply circuit 26.

The power supply 10 is a power supply source provided externally of the semiconductor device 1 and is configured as, for example, a primary cell such as an alkali manganese battery, a secondary cell such as a lithium ion cell, a DC converted household power supply, and the like.

The power supply circuits 20 to 26 stabilize the power output of the power from the power supply 10 and perform voltage conversion, and the like necessary to form a power supply system to supply power to the first and second oscillation signal generating circuits 30 and 31, the first to fourth circuit units 40 to 43, and the control circuit 50, respectively. Furthermore, the power supply circuits 20 to 26 interrupt signals generated by circuits provided in different power supply systems so that they do not influence other circuit elements. For example, even when the voltage of the power supply system of the power supply circuit 21 swings due to an operation of the first circuit unit 40, the semiconductor device 1 is configured such that the voltage swing does not influence the voltage of another power supply circuit.

The first and second oscillation signal generating circuits 30 and 31 generate oscillation signals used in the first to fourth circuit units 40 to 43. In detail, the first oscillation signal generating circuit 30 generates a first oscillation signal having a first frequency and can supply the generated first oscillation signal to the first to fourth circuit units 40 to 43. The second oscillation signal generating circuit 31 generates a second oscillation signal having a second frequency, different than the first frequency, and can supply the generated second oscillation signal to the first to fourth circuit units 40 to 43.

The control circuit 50 performs overall control of various operations performed in the semiconductor device 1. In the embodiment, in particular, control signals for controlling the first and second oscillation signal generating circuits 30 and 31 are generated, and control signals for controlling the first to fourth circuit units 40 to 43 are generated by the control circuit 50.

When the semiconductor device 1 is used for communication, a plurality of power supply systems is generally provided to reduce interference of the signals among different systems. Herein, the number of power supply systems is diversified according to a specification or a communication standard of the semiconductor device 1.

Figure 2:
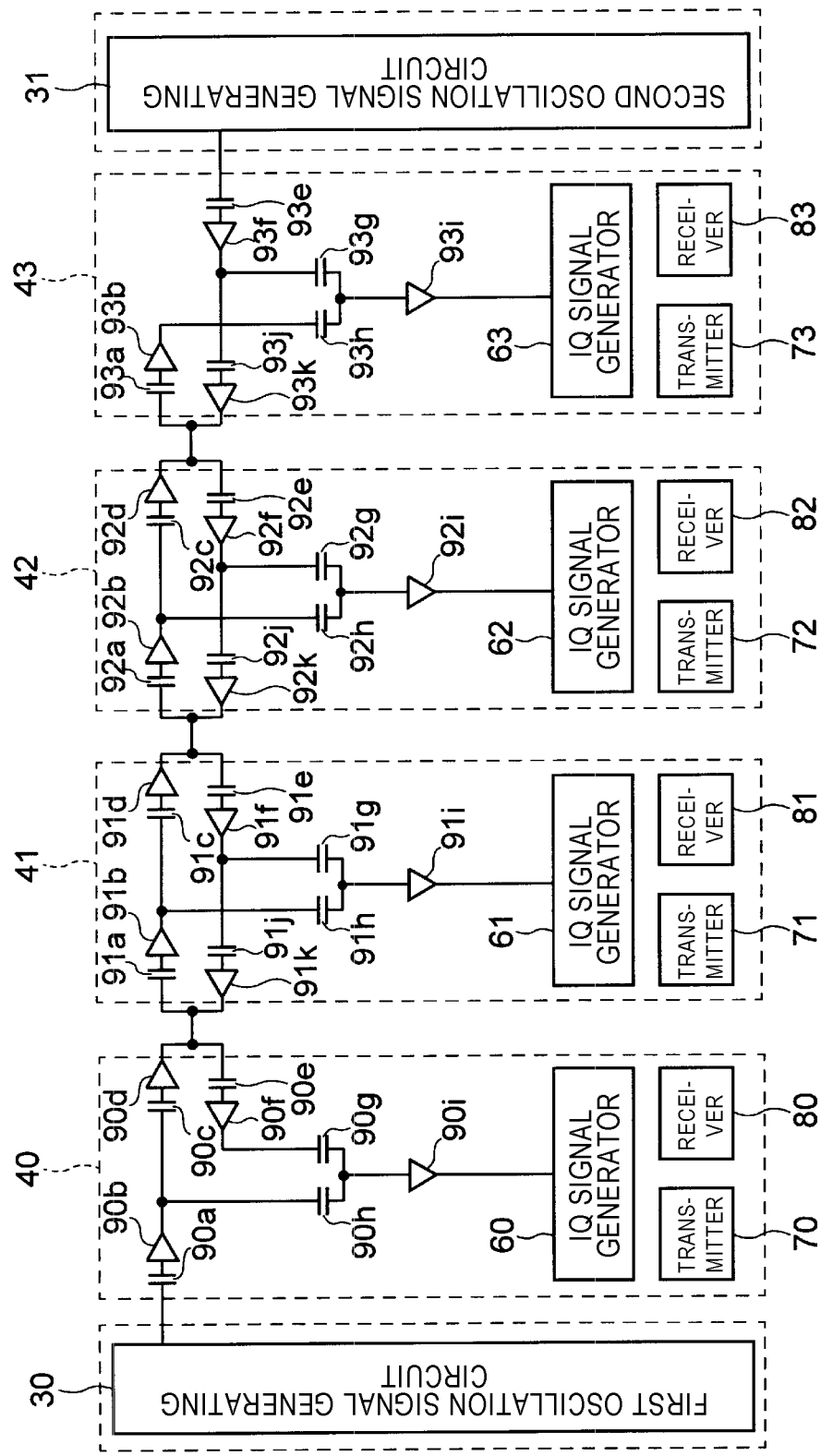
FIG. 2 is a circuit diagram and a block diagram illustrating a part of a circuit configuration in the semiconductor device according to the first embodiment.

FIG. 2 is a circuit diagram and a block diagram for illustrating a part of a circuit configuration in the semiconductor device 1 according to the embodiment.

As illustrated in FIG. 2, the first oscillation signal generating circuit 30 generates the first oscillation signal having the first frequency and outputs the generated first oscillation signal to the first circuit unit 40. In the embodiment, for example, the first frequency is 2 GHz, and an oscillation signal of 2 GHz is input in the first circuit unit 40.

Meanwhile, the second oscillation signal generating circuit 31 generates the second oscillation signal having the second frequency and outputs the generated second oscillation signal to the fourth circuit unit 43. In the embodiment, for example, the second frequency is 5 GHz, and an oscillation signal of 5 GHz is input in the fourth circuit unit 43. Herein, 2 GHz and 5 GHz are just examples for the first frequency and the second frequency, respectively and for example, a case where the first frequency is 5.50 GHz and the second frequency is 5.52 GHz, a case where the first frequency of the first oscillation signal and the second frequency of the second oscillation signal are closer to each other is also included in a range proposed in the embodiment.

The first circuit unit 40 includes an IQ signal generator 60, a transmitter 70, and a receiver 80. The IQ signal generator 60 generates an "I" signal as an in-phase component and a "Q" signal as a quadrature phase component, which are used for modulation and demodulation.

The transmitter 70 quadrature-modulates a transmitted signal to generate a transmission wave using the I and Q signals generated by the IQ signal generator 60. The generated transmission wave is output from an antenna (not illustrated) or the like.

The receiver 80 quadrature-demodulates a reception wave received through the antenna or the like using the I and Q signals generated by the IQ signal generator 60 to generate a received signal. The generated received signal is used for various processing in the semiconductor device 1.

The IQ signal generator 60, the transmitter 70, and the receiver 80 are an example of a first processing unit of the first circuit unit 40 in the embodiment and operate using the power supplied from the power supply system of the power supply circuit 21. Further, the first circuit unit 40 may include circuits that perform other processing by the first processing unit, in addition to the IQ signal generator 60, the transmitter 70, and the receiver 80.

As in the first circuit unit 40, the second circuit unit 41 includes an IQ signal generator 61, a transmitter 71, and a receiver 81 as a second processing unit, the third circuit unit 42 includes an IQ signal generator 62, a transmitter 72, and a receiver 82 as a third processing unit, the fourth circuit unit 43 includes an IQ signal generator 63, a transmitter 73, and a receiver 83 as a fourth processing unit.

Further, in addition to the IQ signal generator 60, the transmitter 70, and the receiver 80, the first circuit unit 40 includes a capacitor 90a, a buffer 90b, a capacitor 90c, a buffer 90d, a capacitor 90e, a buffer 90f, a capacitor 90g, a capacitor 90h, and a buffer 90i.

The output of the first oscillation signal in the first oscillation signal generating circuit 30 is connected to the buffer 90b through the capacitor 90a. As a result, the first oscillation signal having the first frequency is input into the buffer 90b from the first oscillation signal generating circuit 30. Herein, in the embodiment, "input" has a meaning including both a case where a signal is indirectly input into an element through other elements and the like and a case where the signal is directly input to element without passing through other elements and the like.

The output of the buffer 90b is connected to the input of the buffer 90d through the capacitor 90c, and is also connected to the capacitor 90h connected to the input of the buffer 90i. The output of the buffer 90f is connected to the capacitor 90g connected to the input of the buffer 90i. The output of the buffer 90i is input into the IQ signal generator 60.

The buffers 90b, 90d, and 90f may each individually control a selection of whether to output the input signal thereto based on the control signal. The control signals are individually generated by the control circuit 50 illustrated in FIG. 1 for input into the buffers 90b, 90d, and 90f, respectively. That is, those of the buffers 90b, 90d, and 90f receiving the control signals indicating the oscillation signals input thereto shall be output therefrom output the signal, and the buffers 90b, 90d, and 90f receiving control signals indicating to not output the input signals thereto do not output the oscillation signals input thereto.

The buffer 90i needs not be a buffer that individually controls whether to output the input signal based on a separate control signal it receives. That is, even a buffer which non-selectively outputs the input signal thereto may be used. However, like the buffers 90b, 90d, and 90f, the buffer 90i may itself also control whether to output the input signal thereto based on a separate control signal. In this case, when the buffer 90i operates, a control signal indicating the buffer 901 should output the input signal thereto is normally supplied to the buffer 90i.

Further, the buffers 90b, 90d, 90f, and 90i operate using the power supplied from the first power supply system which is the power supply system of the power supply circuit 21, as do the IQ signal generator 60, the transmitter 70, and the receiver 80.

The second circuit unit 41 also includes a capacitor 91a, a buffer 91b, a capacitor 91c, a buffer 91d, a capacitor 91e, a buffer 91f, a capacitor 91g, a capacitor 91h, a buffer 91i, a capacitor 91j, and a buffer 91k, in addition to the IQ signal generator 61, the transmitter 71, and the receiver 81.

The capacitor 91a, the buffer 91b, the capacitor 91c, the buffer 91d, the capacitor 91e, the buffer 91f, the capacitor 91g, the capacitor 91h, and the buffer 91i in the second circuit unit 41 correspond to the capacitor 90a, the buffer 90b, the capacitor 90c, the buffer 90d, the capacitor 90e, the buffer 90f, the capacitor 90g, the capacitor 90h, and the buffer 90i in the first circuit unit 40, respectively.

In addition, the output of the buffer 91f is also connected to the input of the capacitor 91g connected to the buffer 91i, and is connected to the input of the capacitor 91j connected to the buffer 91k. The buffer 91k may individually control whether to output the input signal received thereby based on the control signal, as with the buffers 91b, 91d, and 91f.

The output of the buffer 90d of the first circuit unit 40, the input of the buffer 90f through the capacitor 90e of the first circuit unit 40, the input of the buffer 91b through the capacitor 91a of the second circuit unit 41, and the output of the buffer 91k of the second circuit unit 41 are commonly connected to each other. That is, the transmission path between the buffers 90d and 91b and the transmission path between the buffers 91k and 90f are connected to a common node or line to configure one line. Herein, when the oscillation signal transmitted and received between the first circuit unit 40 and the second circuit unit 41 is a single-phase signal, a physical signal wiring in a 1-line transmission path includes one line, but when the oscillation signal transmitted and received between the first circuit unit 40 and the second circuit unit 41 is a differential signal, the physical signal wiring in the 1-line transmission path includes two lines.

Further, the buffers 91b, 91d, 91f, 91k, and 90i operate using the power supplied from the second power supply system which is the power supply system of the power supply circuit 22, as do the IQ signal generator 61, the transmitter 71, and the receiver 81.

The third circuit unit 42 has the same configuration as the second circuit unit 41 and includes a capacitor 92a, a buffer 92b, a capacitor 92c, a buffer 92d, a capacitor 92e, a buffer 92f, a capacitor 92g, a capacitor 92h, a buffer 92i, a capacitor 92j, and a buffer 92k, in addition to the IQ signal generator 62, the transmitter 72, and the receiver 82.

The capacitor 92a, the buffer 92b, the capacitor 92c, the buffer 92d, the capacitor 92e, the buffer 92f, the capacitor 92g, the capacitor 92h, the buffer 92i, the capacitor 92j, and the buffer 92k in the third circuit unit 42 correspond to the capacitor 91a, the buffer 91b, the capacitor 91c, the buffer 91d, the capacitor 91e, the buffer 91f, the capacitor 91g, the capacitor 91h, the buffer 91i, the capacitor 91j, and the buffer 91k in the second circuit unit 41, respectively.

In addition, the output of the buffer 91d of the second circuit unit 41, the input of the buffer 91f through the capacitor 91e of the second circuit unit 41, the input of the buffer 92b through the capacitor 92a of the third circuit unit 42, and the output of the buffer 92k of the third circuit unit 42 are commonly connected to each other on a common node or line. That is, the transmission path between the buffers 91d and 92b and the transmission path between the buffers 92k and 91f are employed in common to configure one line.

Further, the buffers 92b, 92d, 92f, 92k, and 92i operate using the power supplied from a third power supply system which is the power supply system of the power supply circuit 23, as do the IQ signal generator 62, the transmitter 72, and the receiver 82.

The fourth circuit unit 43 includes a capacitor 93a, a buffer 93b, a capacitor 93e, a buffer 93f, a capacitor 93g, a capacitor 93h, a buffer 93i, a capacitor 93j, and a buffer 93k, in addition to the IQ signal generator 63, the transmitter 73, and the receiver 83.

The capacitor 93a, the buffer 93b, the capacitor 93e, the buffer 93f, the capacitor 93g, the capacitor 93h, the buffer 93i, the capacitor 93j, and the buffer 93k in the fourth circuit unit 43 correspond to the capacitor 92a, the buffer 92b, the capacitor 92e, the buffer 92f, the capacitor 92g, the capacitor 92h, the buffer 92i, the capacitor 92j, and the buffer 92k in the third circuit unit 42, respectively.

However, the output of the second oscillation signal in the second oscillation signal generating circuit 31 is connected to capacitor 93e connected to the input of the buffer 93f. As a result, the second oscillation signal having the second frequency is input into the buffer 93f from the second oscillation signal generating circuit 31.

Further, the output of the buffer 92d of the third circuit unit 42, the input of the buffer 92f through the capacitor 92e of the third circuit unit 42, the input of the buffer 93b through the capacitor 93a of the fourth circuit unit 43, and the output of the buffer 93k of the fourth circuit unit 43 are commonly connected to each other. That is, the transmission path between the buffers 92d and 93b and the transmission path between the buffers 93k and 92f are employed in common to configure one line.

Further, the buffers 93b, 93f, 93k, and 93i operate using the power supplied from a fourth power supply system which is the power supply system of the power supply circuit 24, as do the IQ signal generator 63, the transmitter 73, and the receiver 83.

In addition, a capacitor is connected to the input of each buffer and this is provided in order to interrupt a DC component of the signal using the capacitor. That is, the DC components of the first and second oscillation signals are interrupted (do not pass through) each of the capacitors.

Hereinabove, the circuit configuration of the semiconductor device 1 according to the embodiment has been described. Next, an operation of the semiconductor device 1 will be described.

Figure 3:
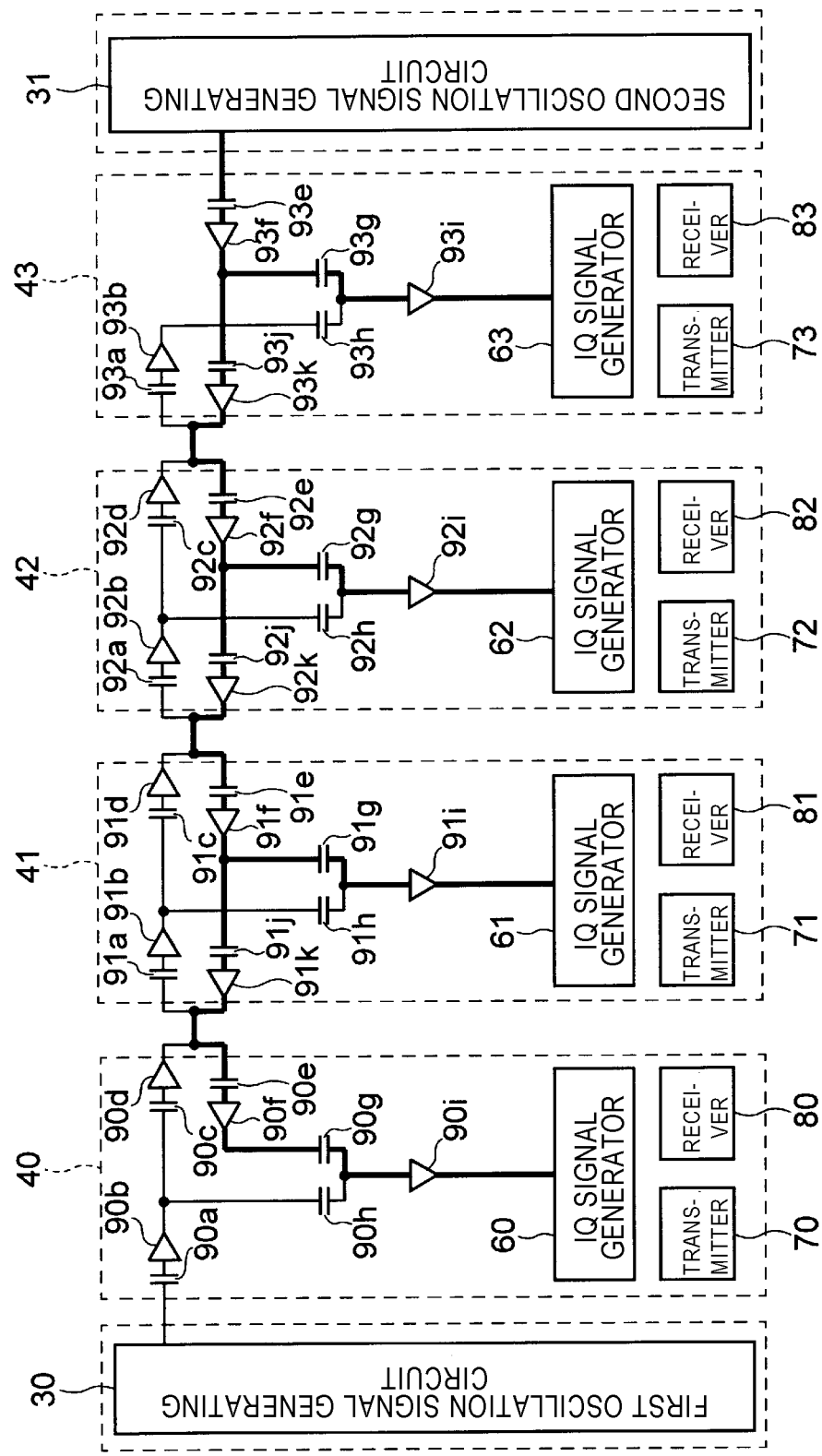
FIG. 3 is a diagram illustrating a circuit state when a second oscillation signal generated by a second oscillation signal generating circuit is supplied to first to fourth circuit units of the circuit configuration of FIG. 2.

FIG. 3 is a diagram illustrating a circuit state when a second oscillation signal generated by a second oscillation signal generating circuit 31 is supplied to first to fourth circuit units 40 to 43, wherein the connection path from the second oscillation signal generating circuit 31 is shown as a bold line. In the embodiment, the circuit state is referred to as a first mode.

As illustrated in FIG. 3, in the first mode, the control signals indicating to not output the input signal are input into the buffers 90b, 90d, 91b, 91d, 92b, 92d, and 93d, and the control signals indicating to output the input signal are input into the buffers 90f, 91k, 91f, 92k, 92f, 93k, and 93f.

As a result, the first oscillation signal generated by the first oscillation signal generating circuit 30 does not pass through the buffer 90b, and, the first oscillation signal is thus not supplied to any of the first to fourth circuit units 40 to 43 other than buffer 90b and capacitor 90a. Meanwhile, the second oscillation signal generated by the second oscillation signal generating circuit 31 is supplied to the IQ signal generators 60 to 63 of the first to fourth circuit units 40 to 43 by sequentially passing through the buffers 93f, 93k, 92f, 92k, 91f, 91k, and 90f.

Figure 4:
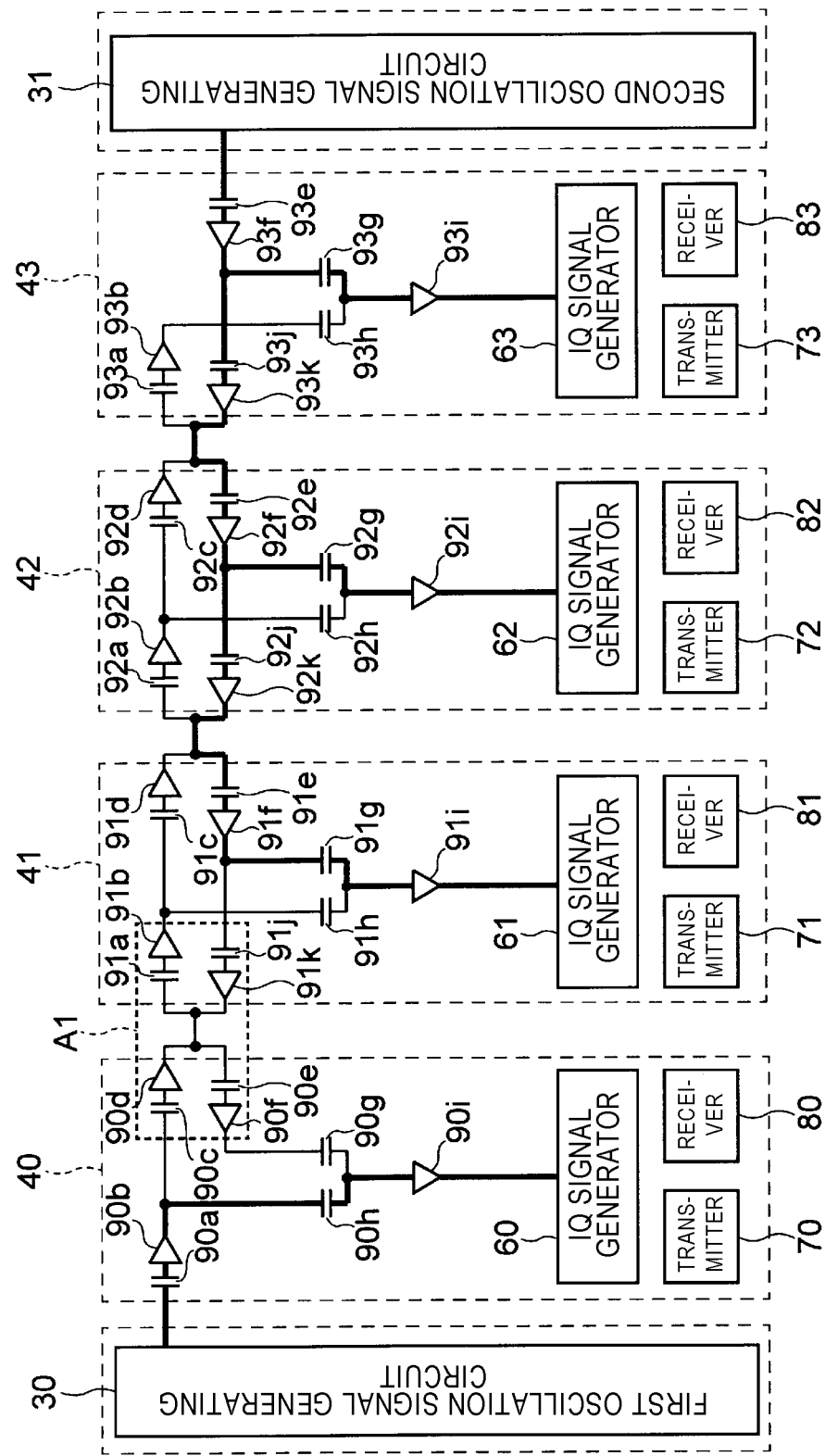
FIG. 4 is a diagram illustrating a circuit state when a first oscillation signal generated by a first oscillation signal generating circuit is supplied to the first circuit unit, and the second oscillation signal generated by the second oscillation signal generating circuit is supplied to the second to fourth circuit units of the circuit configuration of FIG. 2.

FIG. 4 is a diagram illustrating a circuit state when a first oscillation signal generated by a first oscillation signal generating circuit 30 is supplied to the first circuit unit 40, and the second oscillation signal generated by the second oscillation signal generating circuit 31 is supplied to the second to fourth circuit units 41 to 43, wherein the connection paths from the oscillation signal generating circuits 30, 31 are shown as bold lines. In the embodiment, the circuit state is referred to as a second mode.

As illustrated in FIG. 4, in the second mode, control signals indicating to not output the input signals are input into the buffers 90d, 90f, 91b, 91d, 91k, 92b, 92d, and 93d and control signals indicating to output the input signals are input into the buffers 90b, 91f, 92k, 92f, 93k, and 93f.

As a result, the first oscillation signal generated by the first oscillation signal generating circuit 30 is supplied to the IQ signal generator 60 of the first circuit unit 40, but is interrupted by the buffer 90d from passing to the second to fourth circuit units 41 to 43. Meanwhile, the second oscillation signal generated by the second oscillation signal generating circuit 31 is supplied to the IQ signal generators 61 to 63 of the second to fourth circuit units 41 to 43 by sequentially passing through the buffers 93f, 93k, 92f, 92k, and 91f, but is interrupted by the buffer 91k from passing into the first circuit unit 40.

In this case, all the buffers 90d, 90f, 91b, and 91k positioned in the area A1 are in an inactive state and set to not output an input signal thereto. That is, the first circuit unit 40 and the second circuit unit 41 are electrically isolated from each other by the buffers 90d and 91b supplied with power from different power supply systems, and are also electrically isolated from each other by the two buffers 90f and 91k supplied with power from a different power supply system. As a result, since the isolation of the first oscillation signal from the second oscillation signal is high, the occurrence of crosstalk between them is suppressed.

Figure 5:
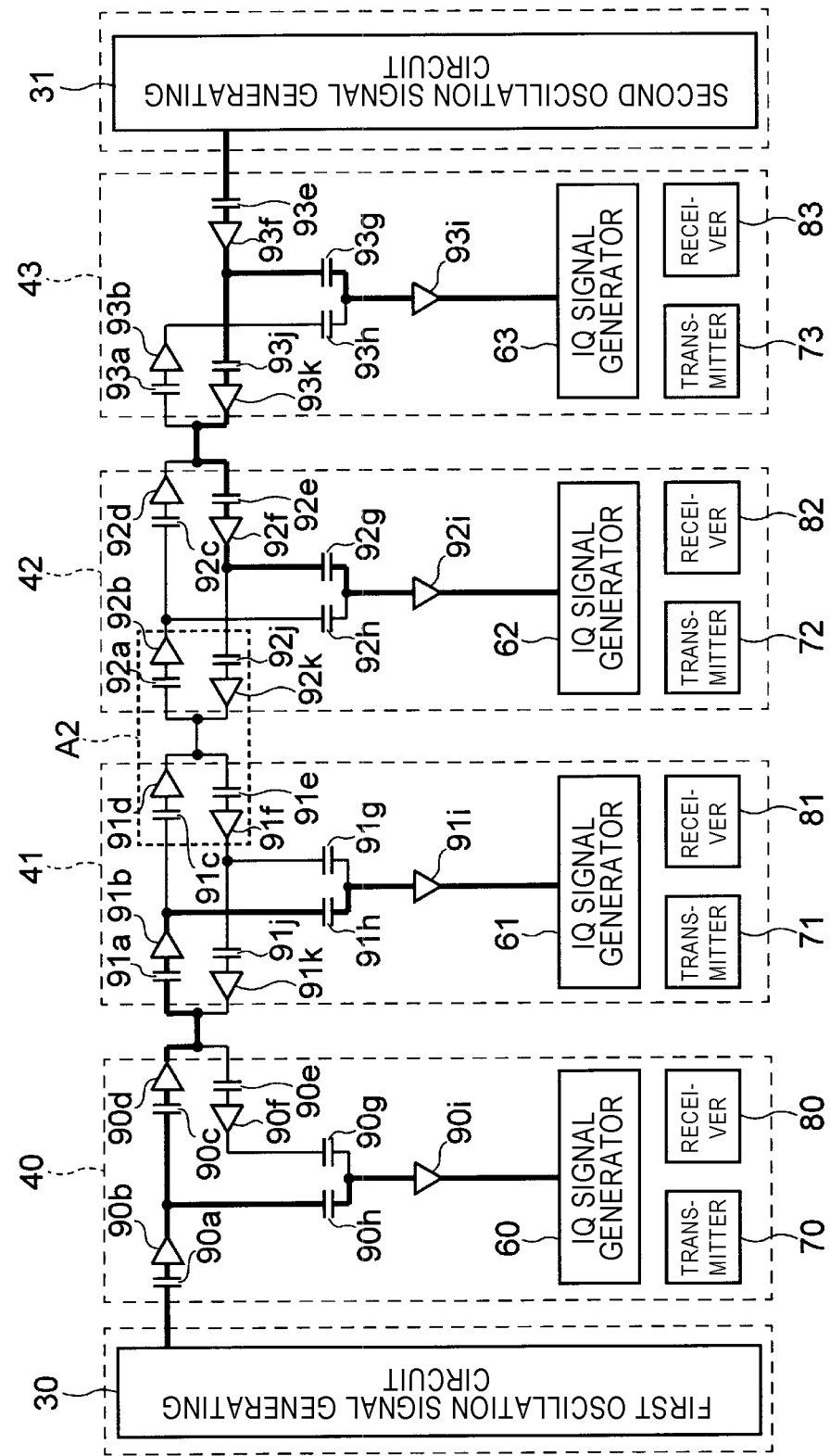
FIG. 5 is a diagram illustrating a circuit state when the first oscillation signal generated by the first oscillation signal generating circuit is supplied to the first and second circuit units, and the second oscillation signal generated by the second oscillation signal generating circuit is supplied to the third and fourth circuit units of the circuit configuration of FIG. 2.

FIG. 5 is a diagram illustrating a circuit state when the first oscillation signal generated by the first oscillation signal generating circuit 30 is supplied to the first and second circuit units 40 and 41, and the second oscillation signal generated by the second oscillation signal generating circuit 31 is supplied to the third and fourth circuit units 42 and 43, wherein the connection paths from the oscillation signal generating circuits 30, 31 are shown as bold lines. In the embodiment, the circuit state is referred to as a third mode.

As illustrated in FIG. 5, in the third mode, the control signals indicating to not output the input signal are input into the buffers 90f, 91d, 91f, 91k, 92b, 92d, 92k, and 93b, and the control signal indicating to output the input signal are input into the buffers 90b, 90d, 91b, 92t, 93k, and 93f.

As a result, the first oscillation signal generated by the first oscillation signal generating circuit 30 is supplied to the IQ signal generators 60 and 61 of the first and second circuit units 40 and 41, but interrupted by the buffer 91d and thus does not pass to the third and fourth circuit units 23, 24. Meanwhile, the second oscillation signal generated by the second oscillation signal generating circuit 31 is supplied to the IQ signal generators 62 and 63 of the third and fourth circuit units 42 and 43 by sequentially passing through the buffers 93f, 93k, and 92f, but interrupted by the buffer 92k and thus does not pass to the second and first circuit units 22, 21.

In this case, all the buffers 91d, 91f, 92b, and 92k positioned in the area A2 are in the inactive state and set to not output the input signal thereto. That is, the second circuit unit 41 and the third circuit unit 42 are electrically isolated from each other by the buffers 91d and 92b supplied with power from different power supply systems, and are also electrically isolated from each other by the buffers 91f and 92k supplied with power from different power supply systems. As a result, since the isolation of the first oscillation signal from the second oscillation signal is high, the occurrence of crosstalk between them is suppressed.

Figure 6:
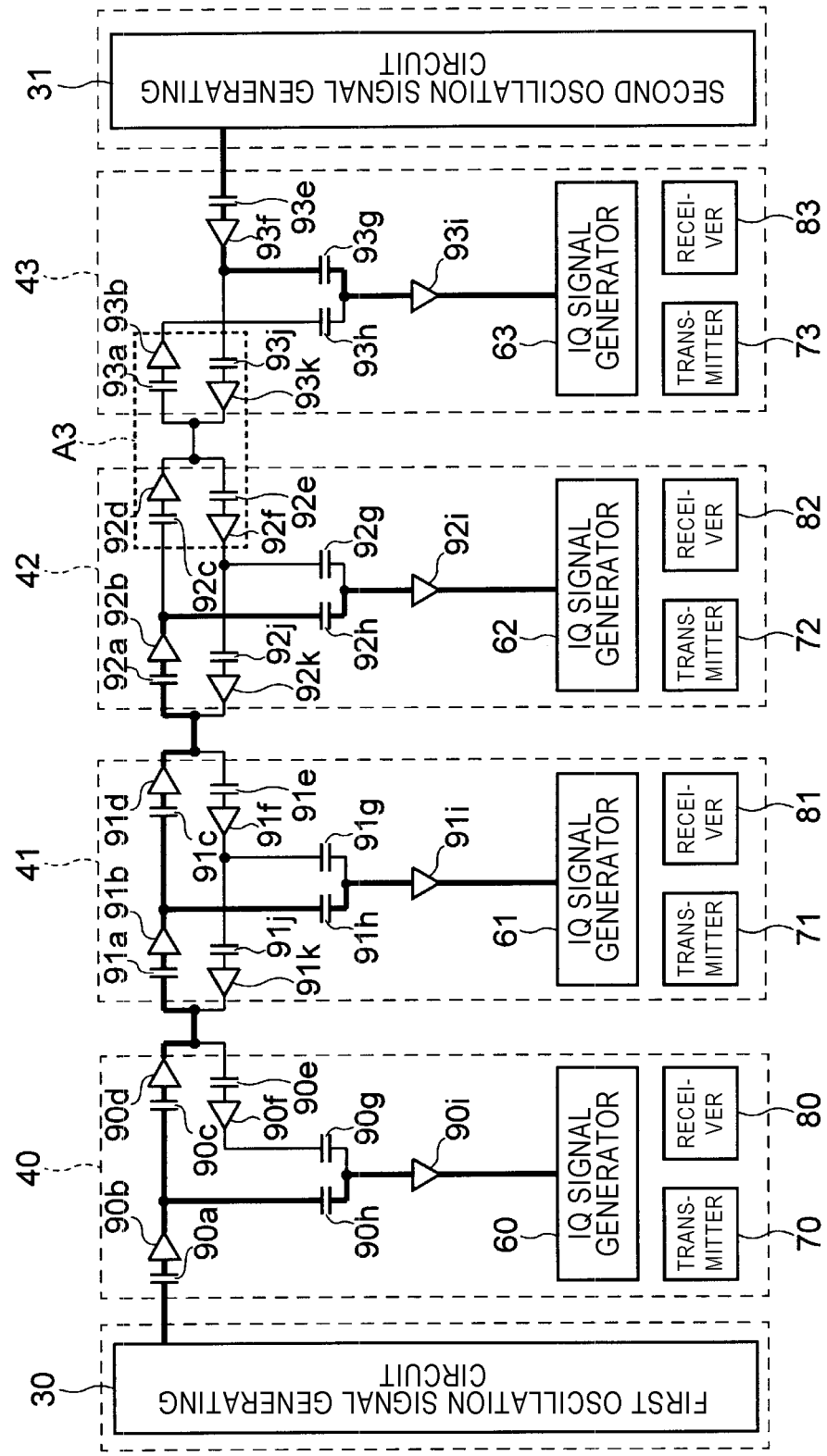
FIG. 6 is a diagram illustrating a circuit state when the first oscillation signal generated by the first oscillation signal generating circuit is supplied to the first to third circuit units, and the second oscillation signal generated by the second oscillation signal generating circuit is supplied to the fourth circuit unit of the circuit configuration of FIG. 2.

FIG. 6 is a diagram illustrating a circuit state when the first oscillation signal generated by the first oscillation signal generating circuit 30 is supplied to the first to third circuit units 40 to 42, and the second oscillation signal generated by the second oscillation signal generating circuit 31 is supplied to the fourth circuit unit 43, wherein the connection paths from the oscillation signal generating circuits 30, 31 are shown as a bold line. In the embodiment, the circuit state is referred to as a fourth mode.

As illustrated in FIG. 6, in the fourth mode, the control signals indicating to not output the input signal are input into the buffers 90f, 91f, 91k, 92d, 92f, 92k, 93b, and 93k, and the control signals indicating to output the input signal are input into the buffers 90b, 90d, 91b, 91d, 92b, and 93f.

As a result, the first oscillation signal generated by the first oscillation signal generating circuit 30 is supplied to the IQ signal generators 60 to 62 of the first to third circuit units 40 to 42, but interrupted by the buffer 92d. Meanwhile, the second oscillation signal generated by the second oscillation signal generating circuit 31 is supplied to the IQ signal generator 63 of the fourth circuit unit 43 bypassing through the buffer 93f, but interrupted by the buffer 93k.

In this case, all the buffers 92d, 92f, 93b, and 93k positioned in an area A3 are in the inactive state and set to not output the input signals thereto. That is, the third circuit unit 42 and the fourth circuit unit 43 are electrically isolated from each other by the two buffers 92d and 93b supplied with power from different power supply systems, and are electrically isolated from each other by the two buffers 92f and 93k supplied with power from different power supply systems. As a result, since the isolation between the first oscillation signal and the second oscillation signal is high, the occurrence of crosstalk between them is suppressed.

Figure 7:
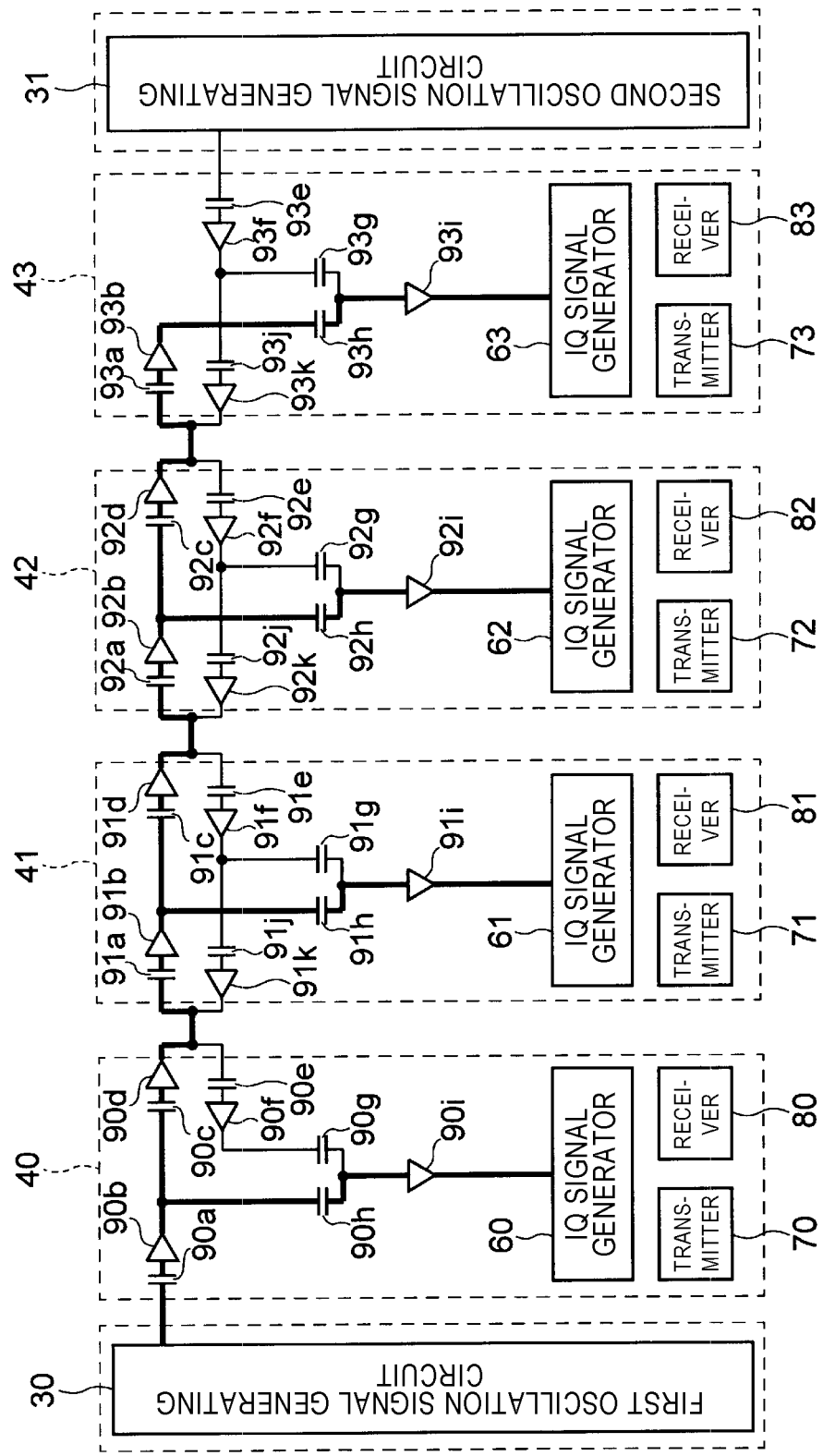
FIG. 7 is a diagram illustrating a circuit state when the first oscillation signal generated by the first oscillation signal generating circuit is supplied to the first to fourth circuit units of the circuit configuration of FIG. 2.

FIG. 7 is a diagram illustrating a circuit state when the first oscillation signal generated by the first oscillation signal generating circuit 30 is supplied to first to fourth circuit units 40 to 43, wherein the connection path from the first oscillation signal generating circuit 30 is shown as a bold line. In the embodiment, the circuit state is referred to as a fifth mode.

As illustrated in FIG. 7, in the fifth mode, the control signals indicating to not output the input signal are input into the buffers 90f, 91f, 91k, 92f, 92k, 93f, and 93k, and the control signals indicating to output the input signal are input into the buffers 90b, 90d, 91b, 91d, 92b, 92d, and 93b.

As a result, the first oscillation signal generated by the first oscillation signal generating circuit 30 is supplied to the IQ signal generators 60 to 63 of the first to fourth circuit units 40 to 43. Meanwhile, the second oscillation signal generated by the second oscillation signal generating circuit 31 is interrupted by the buffer 93f, and the second oscillation signal is not supplied to any of the first to fourth circuit units 40 to 43.

Figure 8:
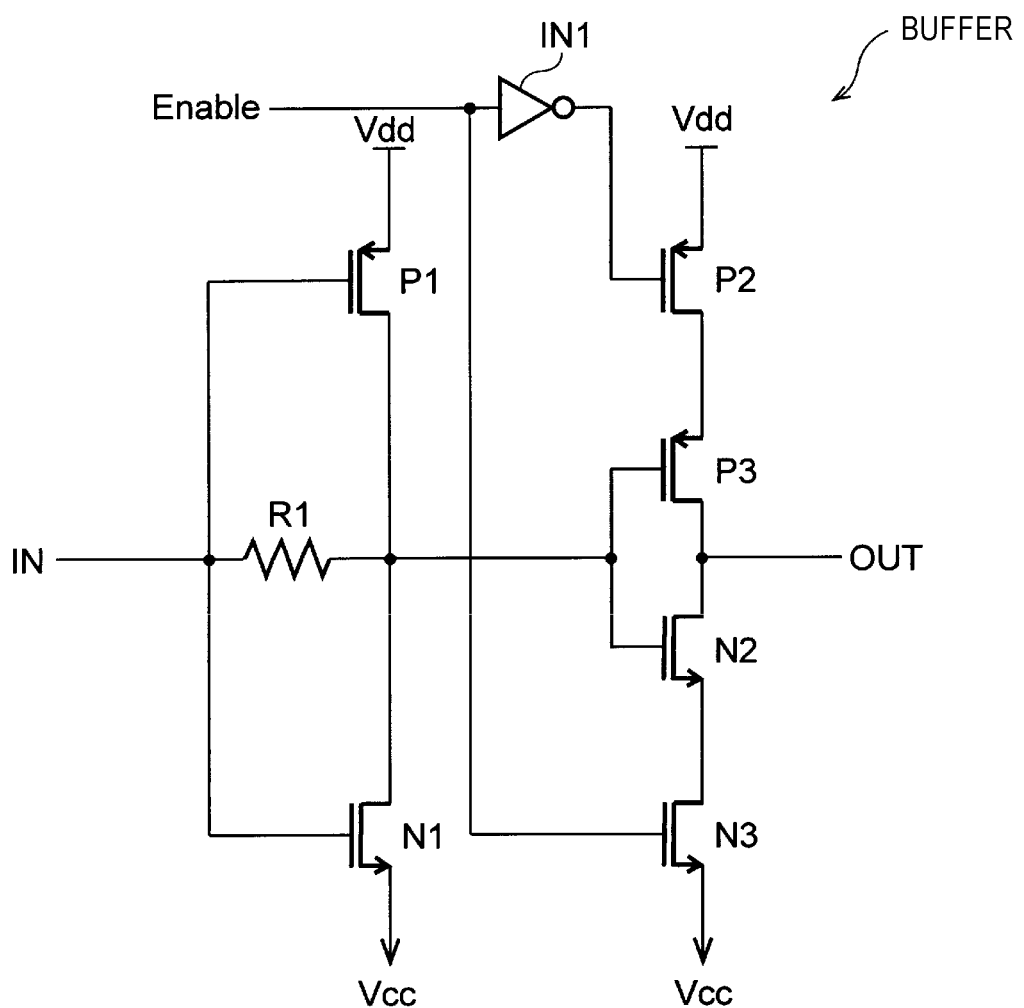
FIG. 8 is a diagram illustrating an exemplary detailed circuit configuration of a buffer capable of individually controlling whether to output an input signal, based on a control signal supplied thereto.

Next, the circuit configuration of a buffer capable of individually controlling whether or not to output an input signal upon receiving a control signal is described with reference to FIG. 8. FIG. 8 is a diagram illustrating an exemplary detailed circuit configuration of a buffer capable of individually controlling whether or not to output an input signal based on the receipt thereby of a control signal.

As illustrated in FIG. 8, the buffer includes P channel MOS transistors P1, P2, and P3, N channel MOS transistors N1, N2, and N3, a resistor R1, and an inverter circuit IN1.

A control terminal of the P channel MOS transistor P1, the control terminal of the N channel MOS transistor N1, and one end of the resistor R1 are each connected to an input terminal, and an input signal IN is input from the input terminal. A first terminal of the P channel MOS transistor P1 is connected to a first power supply Vdd, and a first terminal of the N channel MOS transistor N1 is connected to a second power supply Vcc.

The P channel MOS transistors P2 and P3 and the N channel MOS transistors N2 and N3 are additionally connected in series between the first power supply Vdd and the second power supply Vcc in series. The control terminal of the P channel MOS transistor P3 and the control terminal of the N channel MOS transistor N2 are commonly connected to a second terminal of the P channel MOS transistor P1, a second terminal of the N channel MOS transistor N1, and the other end of the resistor R1.

A control signal "Enable" generated by the control circuit 50 (FIG. 1) is input into the control terminal of the N channel MOS transistor N3. Further, the control signal "Enable" is also input into an inverter circuit IN1 and inverted, and thereafter input into the control terminal of the P channel MOS transistor P2.

Therefore, when a high-level control signal "Enable" is input, the P channel MOS transistor P2 and the N channel MOS transistor N3 are turned ON, and the buffer circuit buffers the input signal IN and outputs the buffered input signal as an output signal OUT. Meanwhile, when a low-level control signal "Enable" which is insufficient to switch the P channel MOS transistor P2 and the N channel MOS transistor N3 to the ON state is input, the P channel MOS transistor P2 and the N channel MOS transistor N3 are turned, or remain, OFF, and the buffer circuit does not output the input signal. That is, the high-level control signal is the control signal indicating to output the input signal by a buffer, and the low-level control signal is the control signal indicating to not output the input signal to a buffer.

In the embodiment, the input signal IN and the output signal OUT are any one of the first oscillation signal and the second oscillation signal. Further, the first power supply Vdd and the second power supply Vcc are supplied from the power supply circuits 20 to 26 of FIG. 1. In more detail, the first power supply Vdd and the second power supply Vcc are supplied to the buffers 90b, 90d, and 90f in the first circuit unit 40 from the power supply circuit 21, the first power supply Vdd and the second power supply Vcc are supplied to the buffers 91b, 91d, 91f, and 91k in the second circuit unit 41 from the power supply circuit 22, the first power supply Vdd and the second power supply Vcc are supplied to the buffers 92b, 92d, 92f, and 92k in the third circuit unit 42 from the power supply circuit 23, and the first power supply Vdd and the second power supply Vcc are supplied to the buffers 93b, 93f, and 93k in the fourth circuit unit 43 from the power supply circuit 24.

As described above, in accordance with the semiconductor device 1 according to the embodiment, the buffer that buffers the first oscillation signal or the second oscillation signal operates using the power supplied to each of the first to fourth circuit units 40 to 43. Further, one or more of the first to fourth circuit units 40 to 43 are electrically isolated from one or more of others of the first to fourth circuit units 40 to 43 by two inactive (in a non-signal transmitting state) buffers. As a result, since the isolation between the first oscillation signal and the second oscillation signal is high, the occurrence of crosstalk between them is suppressed.

In addition, since the first oscillation signal and the second oscillation signal are transmitted and received among the first to fourth circuit units 40 to 43 by using the 1-line transmission path, a layout area of the device is reduced. In particular, when the frequency of the first oscillation signal and the frequency of the second oscillation signal are close to each other, because the transmission paths of two the signals need to be separated as far apart as possible, there is a possibility that the layout area of the device will be increased. However, as described in the embodiment, the transmission paths are employed in common as a single one-line transmission path to compress the layout area of the device.

Figure 9:
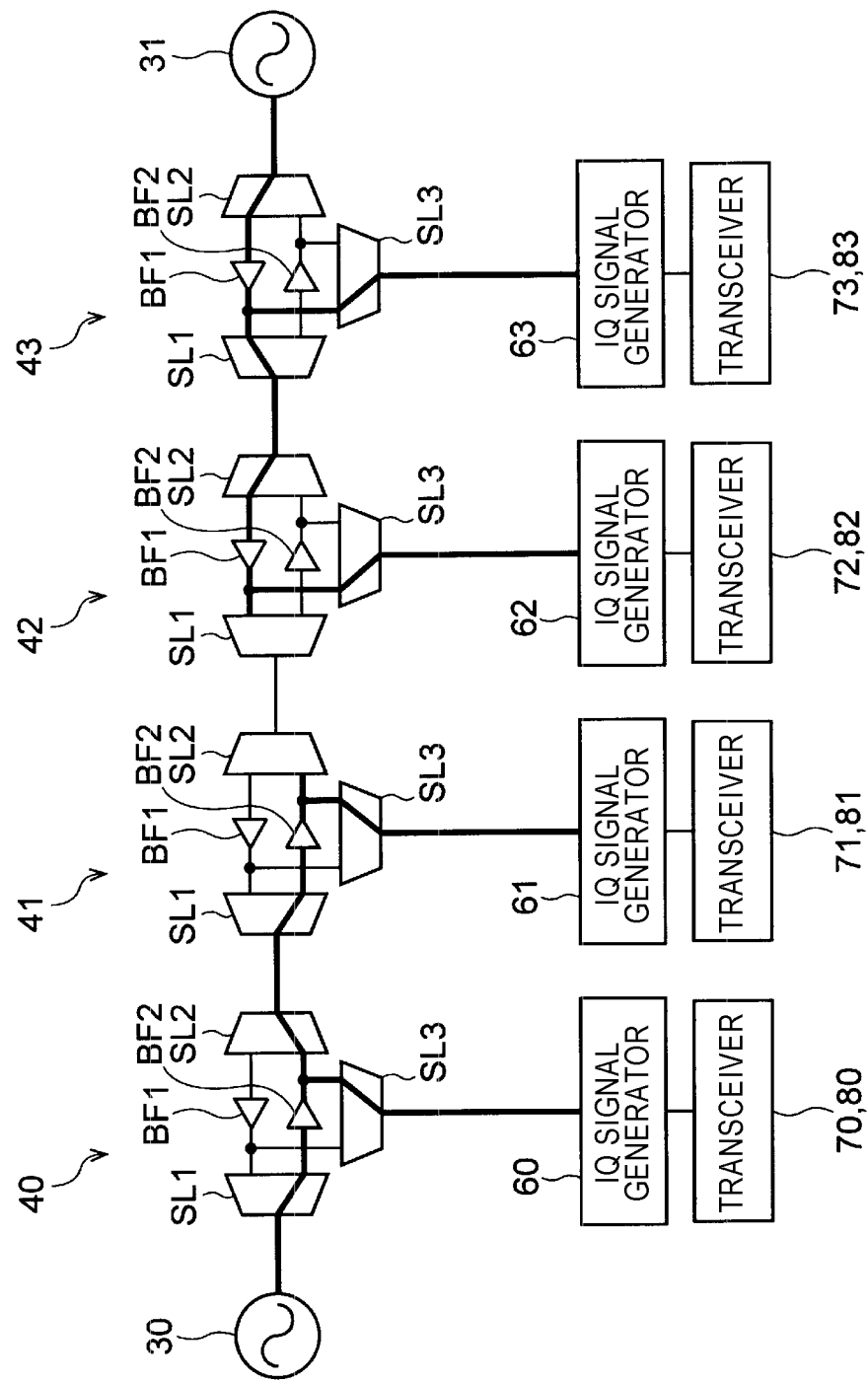
FIG. 9 is a block circuit diagram functionally illustrating the semiconductor device according to the first embodiment.

FIG. 9 is a block circuit diagram functionally illustrating the semiconductor device 1 according to the embodiment. As illustrated in FIG. 9, the semiconductor device 1 has one of the first oscillation signal or the second oscillation signal reaching each of the first to fourth circuit units 40 to 43 in alternative paths to the IQ signal generators 60 to 63, without crossing or coming into close contact with each other. In order to implement this functionality, each of the first to fourth circuit units 40 to 43 may be broadly considered to include selection circuits SL1, SL2, and SL3, and buffers BF1 and BF2.

The selection circuits SL1, SL2, and SL3 output one of the first oscillation signal and the second oscillation signal which are input thereto, and which oscillation signal is output is switched (chosen) based on the control signal input from the control circuit 50. Each of the buffers BF1 and BF2 buffers and outputs the input first oscillation signal or second oscillation signal, based on the oscillation signal delivered thereto by the selection circuits SL1 and SL2.

The first oscillation signal generated by the first oscillation signal generating circuit 30 and the second oscillation signal generated by the second oscillation signal generating circuit 31 reach the first to fourth circuit units 40 to 43 through alternative paths formed by control of the selection circuits SL1 and SL2, and are supplied to the IQ signal generators 60 to 63 by control of the selection circuit SL3. That is, the first oscillation signal and the second oscillation signal are supplied to the IQ signal generators 60 to 63 without crossing or coming into close proximity with each other by controlling the selection circuits SL1, SL2, and SL3 using the control signal.

Figure 10:
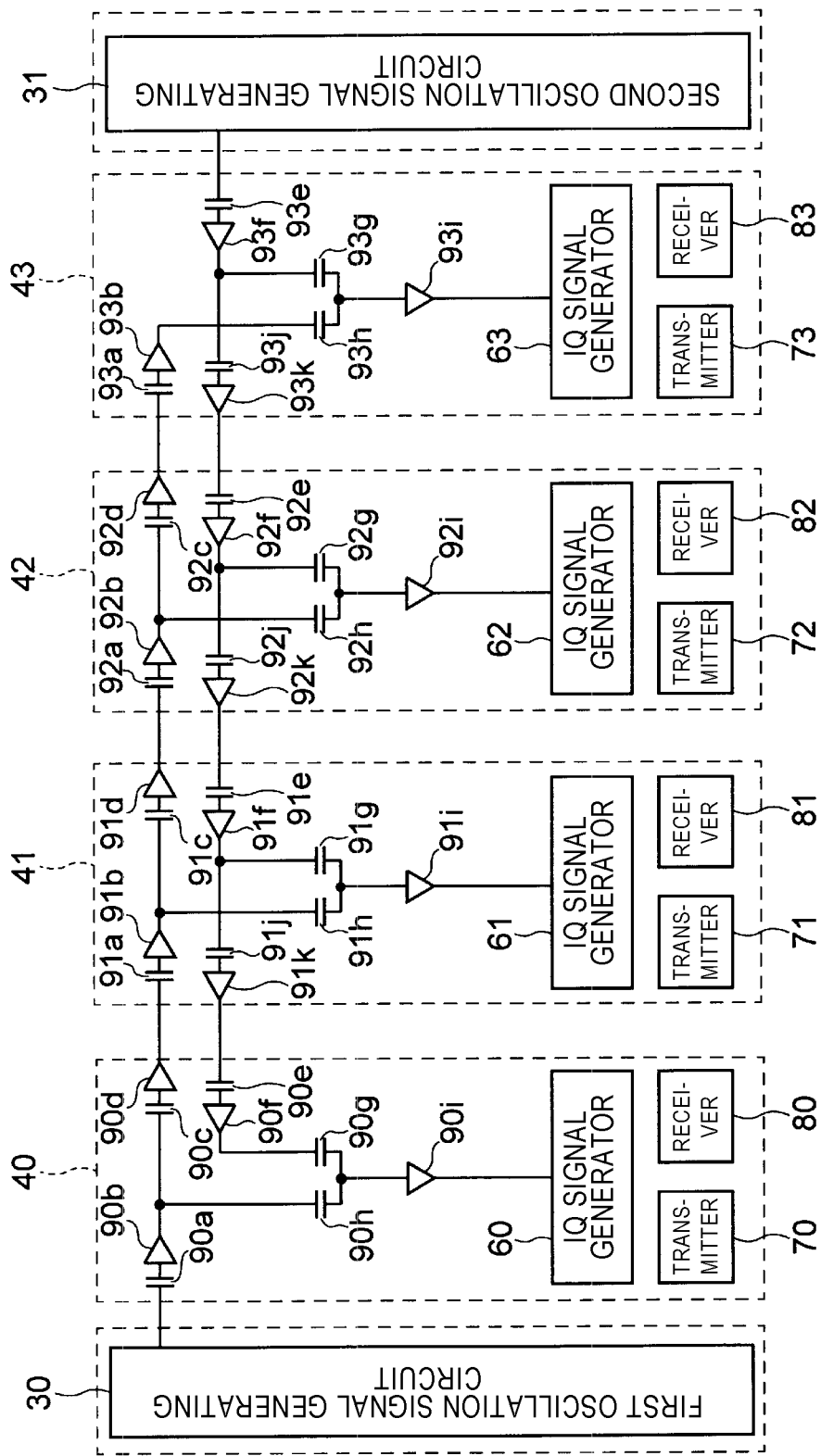
FIG. 10 is a diagram illustrating a modification of the semiconductor device according to the first embodiment and a diagram corresponding to FIG. 2.

Further, as illustrated in FIG. 10, in the semiconductor device 1 according to the embodiment, as an alternate to the one line transmission path connected at a single node, the transmission paths between respective ones of the respective first to fourth circuits 40 and 43 may include two lines. That is, the transmission path of the first oscillation signal and the transmission path of the second oscillation signal may be separately provided between adjacent ones of the first to fourth circuits 40. In this case, the layout area of the transmission path increases accordingly. However, the first oscillation signal and the second oscillation signal may be supplied to different circuit units in a predetermined combination of the first to fourth circuit units 40 to 43. For example, the first oscillation signal may be supplied from the first oscillation signal generating circuit 30 to the first circuit unit 40 and the third circuit unit 42, and the second oscillation signal may be supplied from the second oscillation signal generating circuit 31 to the second circuit unit 41 and the fourth circuit unit 43.

Figure 11:
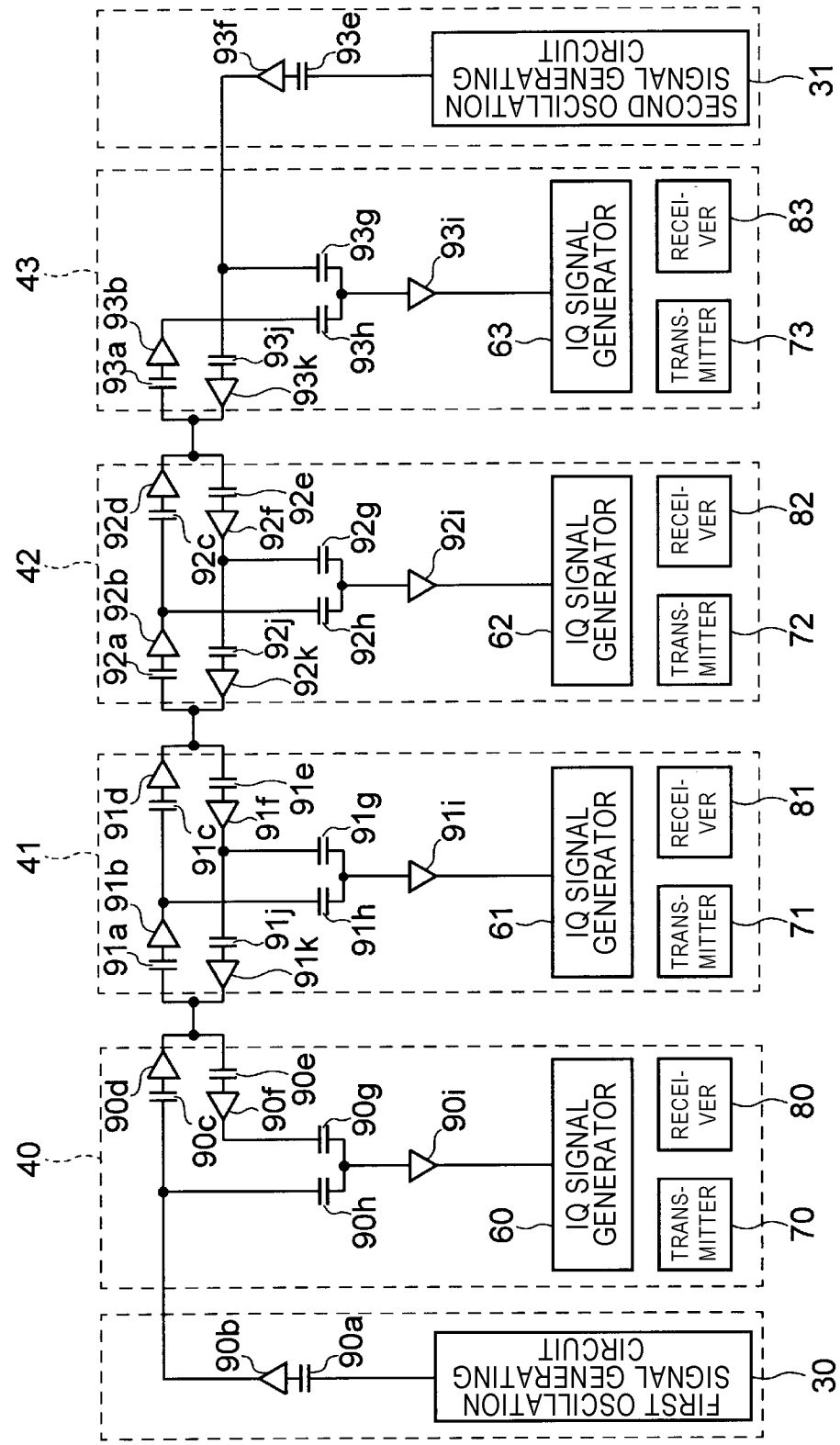
FIG. 11 is a diagram illustrating another modification of the semiconductor device according to the first embodiment and a diagram corresponding to FIG. 2.

Further, as illustrated in FIG. 11, in the semiconductor device 1 according to the embodiment, the capacitor 90a and the buffer 90b may be provided near the output of the first oscillation signal generating circuit 30, the buffer 90b may operate based on the power acquired from the power supply system of the same power supply circuit 20 as the first oscillation signal generating circuit 30, the capacitor 93e and the buffer 93f may be provided near the output of the second oscillation signal generating circuit 31, and the buffer 93f may operate based on the power acquired from the power supply system of the same power supply circuit 25 as the second oscillation signal generating circuit 31.

Second Embodiment

In the second embodiment, the first embodiment is modified such that the first oscillation signal generating circuit 30 generates the first oscillation signal and the second oscillation signal, and supplies the generated first and second oscillation signals to only the first and second circuit units 40 and 41. The second oscillation signal generating circuit 31 also generates the first oscillation signal and the second oscillation signal, and can supply the generated first and second oscillation signals to the first to fourth circuit units 40 to 43 to reduce the layout area. Hereinafter, elements different from the first embodiment will be described.

Figure 12:
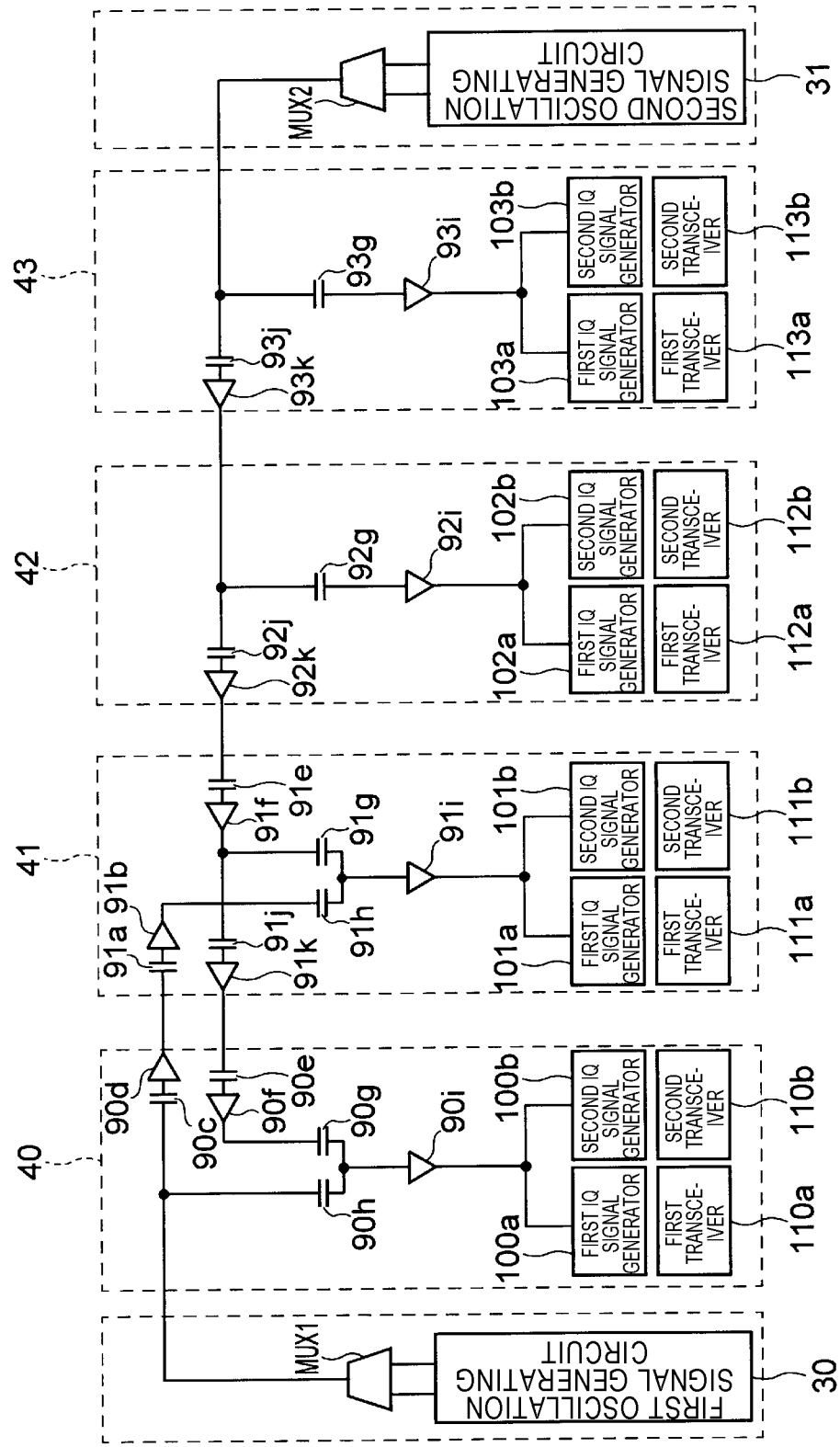
FIG. 12 is a circuit diagram and a block diagram illustrating a part of a circuit configuration in a semiconductor device according to a second embodiment.

FIG. 12 is a circuit diagram and a block diagram for illustrating a part of a circuit configuration in the semiconductor device 1 according to the embodiment, and is a diagram corresponding to FIG. 2 in the first embodiment.

As illustrated in FIG. 12, the first oscillation signal generating circuit 30 in the embodiment generates both the first oscillation signal having the first frequency and the second oscillation signal having the second frequency, and outputs the generated first and second oscillation signals to a selection circuit MUX1. Like the first embodiment, for example, the first frequency is 2 GHz and the second frequency is 5 GHz.

A control signal is input into the selection circuit MUX1 from the control circuit 50 illustrated in FIG. 1, and based upon the control signal the selection circuit MUX1 outputs only one of the first oscillation signal and the second oscillation signal, or outputs neither of the first oscillation signal or the second oscillation signal which are input thereto. The selection circuit MUX1 operates using the power supplied from the power supply system of the power supply circuit 20 in the same manner as the first oscillation signal generating circuit 30 of the first embodiment.

The second oscillation signal generating circuit 31 also generates both the first oscillation signal having the first frequency and the second oscillation signal having the second frequency, and outputs the generated first and second oscillation signals to a selection circuit MUX2. Like the first oscillation signal generating circuit 30, for example, the first frequency is 2 GHz and the second frequency is 5 GHz. Further, like the first embodiment, 2 GHz and 5 GHz are just examples for the first frequency and the second frequency, respectively. For example, as in a case where the first frequency is 5.50 GHz and the second frequency is 5.52 GHz, a case where the first frequency of the first oscillation signal and the second frequency of the second oscillation signal are closer to each other is also included in a range proposed in the embodiment.

A control signal is input into the selection circuit MUX2 from the control circuit 50 illustrated in FIG. 1, and the selection circuit MUX2 outputs only one of the first oscillation signal and the second oscillation signal, based on the control signal it receives. The selection circuit MUX2 operates using the power supplied from the power supply circuit in the same manner as the second oscillation signal generating circuit 31.

Where one of the first oscillation signal or the second oscillation signal is output from the selection circuit MUX1, it is supplied to the first circuit unit 40. In detail, the first oscillation signal or the second oscillation signal is input into the buffer 90d through the capacitor 90c and input into the buffer 90i through the capacitor 90h.

The first circuit unit 40 includes a first IQ signal generator 100a, a second IQ signal generator 100b, a first transceiver 110a, and a second transceiver 110b, and one of the first oscillation signal or the second oscillation signal is output from the buffer 90i selectively into one of the first IQ signal generator 100a and the second IQ signal generator 100b. That is, when the first oscillation signal is output from the buffer 90i, the first IQ signal generator 100a operates to perform transmission and reception using the first transceiver 110a. Meanwhile, when the second oscillation signal is output from the buffer 90i, the second IQ signal generator 100b operates to perform the transmission and reception using the second transceiver 110b.

Further, in FIG. 12, the "transmitter" and the "receiver" of the first embodiment are merged and regarded as a "transceiver" which is expressed as one block, but the transceiver has the same function as the first embodiment which expresses the "transmitter" and the "receiver" as separate blocks.

Similarly, the first oscillation signal or the second oscillation signal is output from each of the buffers 91i, 92i, and 93i of the second to fourth circuit units 41 to 43. When the first oscillation signal is output, the first IQ signal generators 101a, 102a, and 103a operate, and, the transmission and reception are performed by using first transceiver 111a, 112*a*, and 113*a*. When the second oscillation signal is output, the second IQ signal generators 101*b*, 102*b*, and 103*b* operate, and, the transmission and reception are performed by using second transceivers 111*b*, 112*b*, and 113*b*.

However; the first oscillation signal or the second oscillation signal may be supplied to the first circuit unit and the second circuit unit 41 from both the first oscillation signal generating circuit 30 and the second oscillation signal generating circuit 31, while the first oscillation signal or the second oscillation signal may be supplied to the third circuit unit 42 and the fourth circuit unit 43 only from the second signal generating circuit 31. However, neither the first oscillation signal nor the second oscillation signal may be supplied from the first oscillation signal generating circuit 30.

Further, unlike the first embodiment, the 2-line transmission path is provided between the first circuit unit 40 and the second circuit unit 41. That is, a first 1-line dedicated transmission path is provided between the buffers 90*d* and 91*b*, and a second 1-line dedicated transmission path is provided between the buffers 90*f* and 91*k*.

Moreover, since the buffer 93*k* provided in the fourth circuit unit 43 non-selectively outputs the first oscillation signal or second oscillation signal input thereto, the buffer 93*k* is not capable of selectively allowing output of the oscillation signal input thereto based on a separate control signal. However, the buffer 93*k* may comprise a buffer that can control whether to output the input signal thereto based on the separate control signal as with the first embodiment. In this case, when the buffer 93*k* so operates, a control signal indicating outputting the input signal is normally input to the buffer 93*k*.

Hereinabove, the circuit configuration of the semiconductor device 1 according to the embodiment has been described. Next, the operation of the semiconductor device 1 will be described.

<First Oscillation Signal×4 or Second Oscillation Signal×4>

Figure 13:
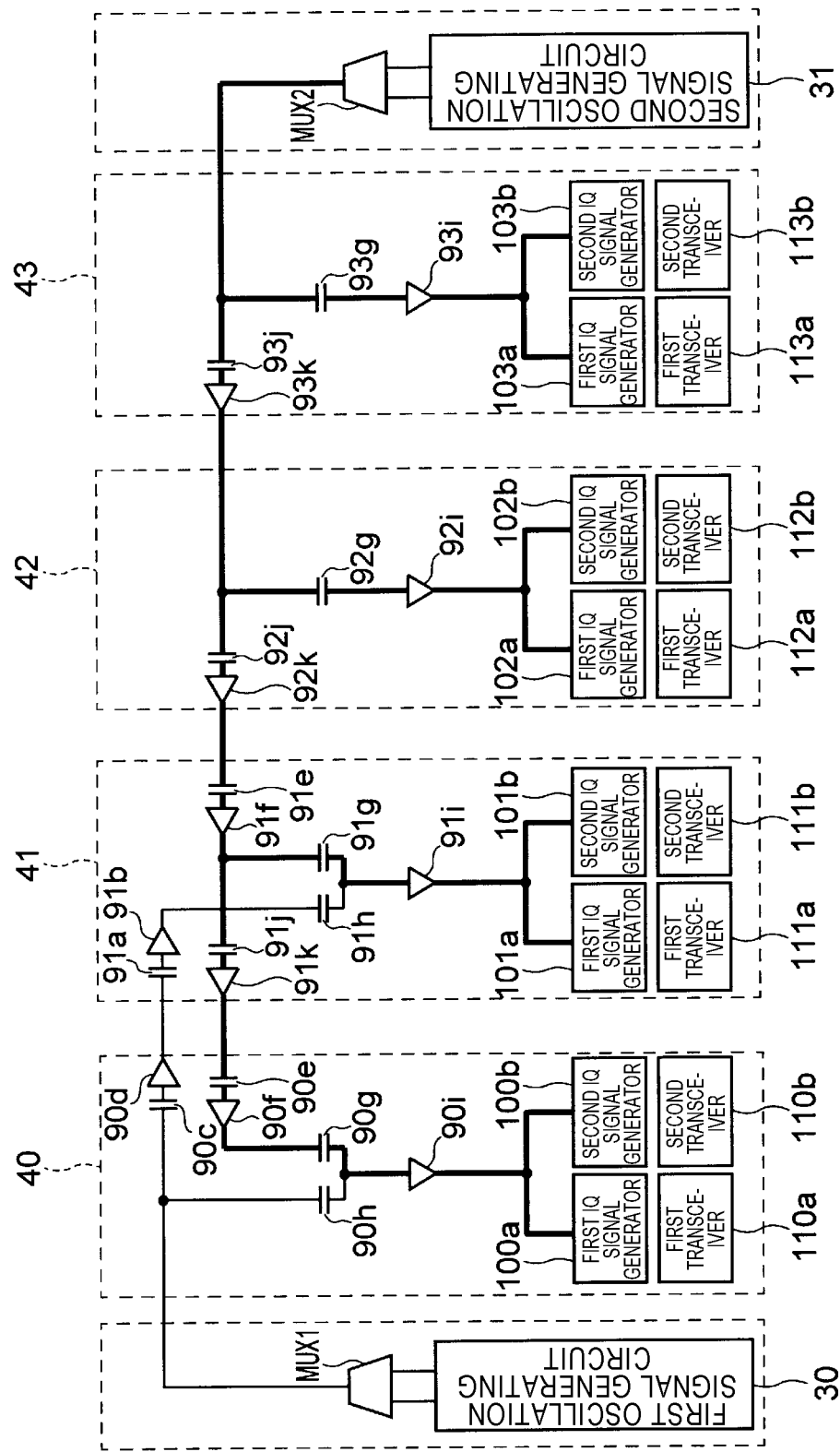
FIG. 13 is a diagram illustrating a circuit state when the first oscillation signal is supplied to the first to fourth circuit units or when the second oscillation signal is supplied to the first to fourth circuit units of the circuit configuration of FIG. 12.

FIG. 13 is a diagram illustrating a circuit state when the first oscillation signal is supplied to the first to fourth circuit units 40 to 43 or when the second oscillation signal is supplied to the first to fourth circuit units 40 to 43. In the embodiment, the circuit state is referred to as a first mode.

As illustrated in FIG. 13, in the first mode, the control signals indicating to not output the input signal are input into the buffers 90*d* and 91*b*, and the control signal indicating to output the input signals are input into the buffers 90*f*, 91*k*, 91*f*, and 92*k*. Further, the control signal indicating to not output either of the first oscillation signal or the second oscillation signal is input into the selection circuit MUX1.

Therefore, when the control signal selecting the first oscillation signal is input into the selection circuit MUX2, the first oscillation signal is supplied to the first to fourth circuit units 40 to 43 by sequentially passing through the buffers 93*k*, 92*k*, 91*f*, 91*k*, and 90*f*.

Meanwhile, when the control signal selecting the second oscillation signal is input into the selection circuit MUX2, the second oscillation signal is supplied to the first to fourth circuit units 40 to 43 by sequentially passing through the buffers 93*k*, 92*k*, 91*f*, 91*k*, and 90*f*.

<First Oscillation Signal×1+Second Oscillation Signal×3, or First Oscillation Signal×3+Second Oscillation Signal×1>

Figure 14:
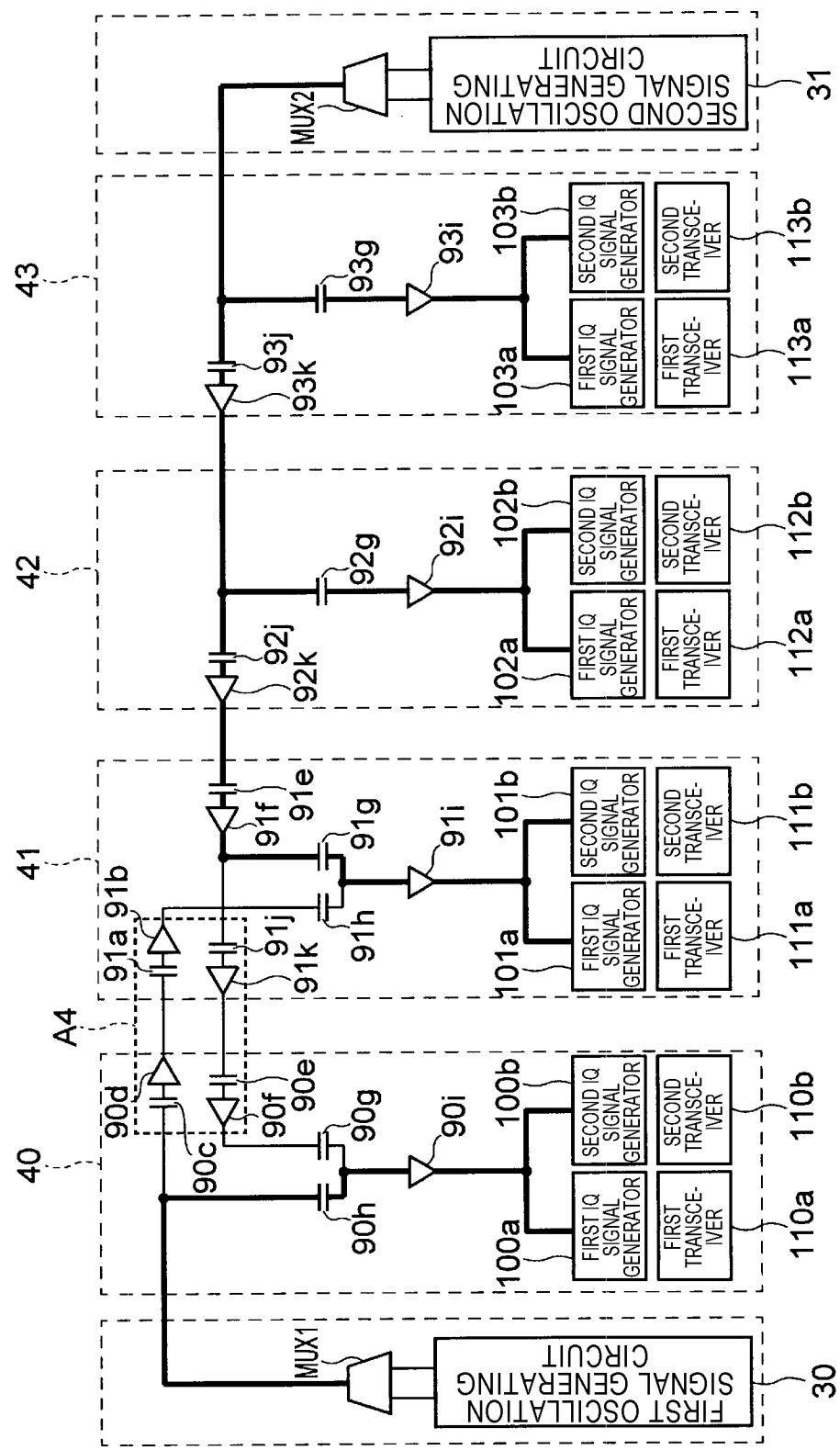
FIG. 14 is a diagram illustrating a circuit state when the first oscillation signal is supplied to the first circuit unit, and the second oscillation signal is supplied to the second to fourth circuit units or when the second oscillation signal is supplied to the first circuit unit, and the first oscillation signal is supplied to the second to fourth circuit units of the circuit configuration of FIG. 12.

FIG. 14 is a diagram illustrating a circuit state when the first oscillation signal is supplied to the first circuit unit 40, and the second oscillation signal is supplied to the second to fourth circuit units 41 to 43 or when the second oscillation signal is supplied to the first circuit unit 40 and the first oscillation signal is supplied to the second to fourth circuit units 41 to 43. In the embodiment, the circuit state is referred to as a second mode.

As illustrated in FIG. 14, in the second mode, the control signals indicating to not output the input signal are input to the buffers 90*d*, 90*f*, 91*b*, and 91*k*, and the control signals indicating to output the input signal are input into the buffers 91*f* and 92*k*.

As a result, when the control signal for selecting the first oscillation signal is input to the selection circuit MUX1 and the control signal for selecting the second oscillation signal is input to the selection circuit MUX2, the first oscillation signal is supplied from the selection circuit MUX1 to the first circuit unit 40. The second oscillation signal is supplied to the second to fourth circuit units 41 to 43 from the selection circuit MUX2 by sequentially passing through the buffers 93*k*, 92*k*, and 91*f*.

Meanwhile, when the control signal for selecting the second oscillation signal is input to the selection circuit MUX1 and the control signal for selecting the first oscillation signal is input to the selection circuit MUX2, the second oscillation signal is supplied from the selection circuit MUX1 to the first circuit unit 40. The first oscillation signal is supplied to the second to fourth circuit units 41 to 43 from the selection circuit MUX2 by sequentially passing through the buffers 93*k*, 92*k*, and 91*f*.

In this case, all the buffers 90*d*, 90*f*, 91*b*, and 91*k* positioned in an area A4 are in the inactive state so as to not output the input signals input thereto. That is, the first circuit unit 40 and the second circuit unit 41 are electrically isolated from each other by the two buffers 90*d* and 91*b* supplied with power from different power supply systems, and are also electrically isolated from each other by the two buffers 90*f* and 91*k* supplied with power from different power supply systems. As a result, the electrical isolation between the first oscillation signal and the second oscillation signal is high, and the occurrence of between them is suppressed.

<First Oscillation Signal×2 or Second Oscillation Signal×2>

Figure 15:
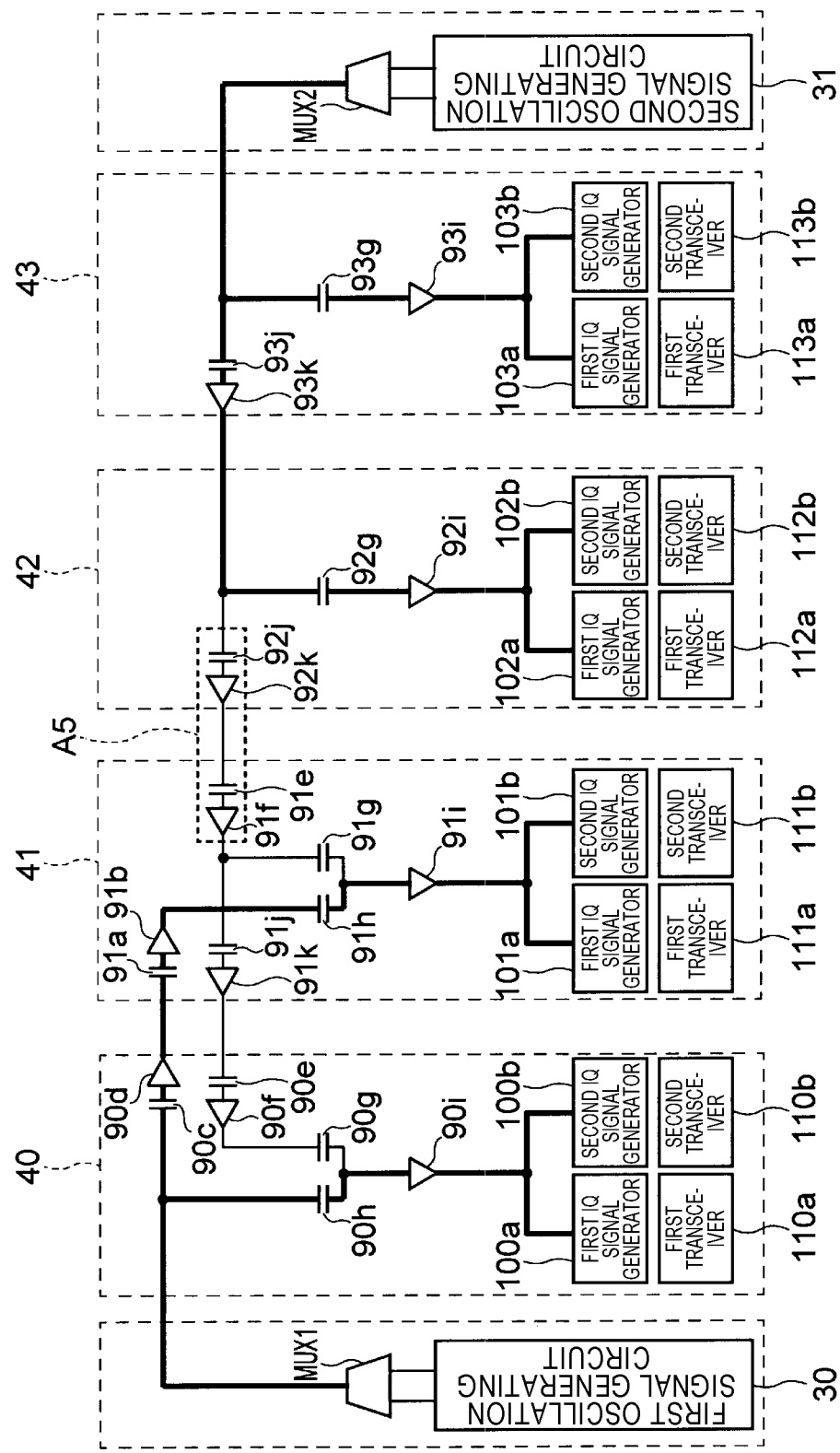
FIG. 15 is a diagram illustrating a circuit state when the first oscillation signal is supplied to the first and second circuit units, and the second oscillation signal is supplied to the third and fourth circuit units or when the second oscillation signal is supplied to the first and second circuit units, and the first oscillation signal is supplied to the third and fourth circuit units of the circuit configuration of FIG. 12.

FIG. 15 is a diagram illustrating a circuit state where the first oscillation signal is supplied to the first and second circuit units 40 and 41 and the second oscillation signal is supplied to the third and fourth circuit units 42 to 43, or where the second oscillation signal is supplied to the first and second circuit units 40 and 41 and the first oscillation signal is supplied to the third and fourth circuit units 42 and 43. In the embodiment, the circuit state is referred to as a third mode.

As illustrated in FIG. 15, in the third mode, the control signals indicating to not output the input signal are input into the buffers 90*f*, 91*f*, 91*k*, and 92*k*, and the control signals indicating to output the input signals are input into the buffers 90*d* and 91*b*.

As a result, when the control signal for selecting the first oscillation signal is input to the selection circuit MUX1 and the control signal for selecting the second oscillation signal is input in the selection circuit MUX2, the first oscillation signal is supplied from the selection circuit MUX1 to the first and second circuit units 40 and 41, and the second oscillation signal is supplied to the third and fourth circuit units 42 and 43 from the selection circuit MUX2 by passing through the buffer 93*k*.

Likewise, where the control signal for selecting the second oscillation signal is input to the selection circuit MUX1 and the control signal for selecting the first oscillation signal is input to the selection circuit MUX2, the second oscillation signal is supplied from the selection circuit MUX1 to the first and second circuit units 40 and 41, and the first oscillation signal is supplied to the third and fourth circuit units 42 and 43 from the selection circuit MUX2 after passing through the buffer 93k.

In this case, all the buffers 91f and 92k positioned in an area A5 of FIG. 15 are in the inactive state so as to not output the input signals input thereto. That is, the second circuit unit 41 and the third circuit unit 42 are electrically isolated from each other by the two buffers 91f and 92k supplied with power from different power supply systems. As a result, since the electrical isolation between the first oscillation signal and the second oscillation signal is high, the occurrence of crosstalk between them is suppressed.

As described above, in accordance with the semiconductor device 1 according to the embodiment, the buffer that buffers the first oscillation signal or the second oscillation signal operates using the power supplied to each of the first to fourth circuit units 40 to 43. Further, the first and third circuit units 40 and 42 are separated by two inactive buffers, so that only one signal passes through the 2-line transmission path between the first and second transmission units 40, 41. As a result, since the isolation between the first oscillation signal and the second oscillation signal is high, the occurrence of crosstalk between them is suppressed.

Further, both the first oscillation signal generating circuit 30 and the second oscillation signal generating circuit 31 generate both the first oscillation signal and the second oscillation signal to selectively supply the first oscillation signal or the second oscillation signal to the first and second circuit units 40 and 41 from the first oscillation signal generating circuit 30 and to selectively supply the first oscillation signal or the second oscillation signal to the first to fourth circuit units 40 to 43 from the second oscillation signal generating circuit 31. As a result, the first oscillation signal may be supplied to and the second oscillation signal may be supplied to the required number of circuit units by arbitrarily combining an active state and the inactive state of the buffer. Further, since the transmission path of the oscillation signal between the second circuit unit 41 and the third circuit unit 42 only includes one line and the transmission path of the oscillation signal between the third circuit unit 42 and the fourth circuit unit 43 only includes one line, the layout area of the circuit may be compressed or reduced.

Figure 16:
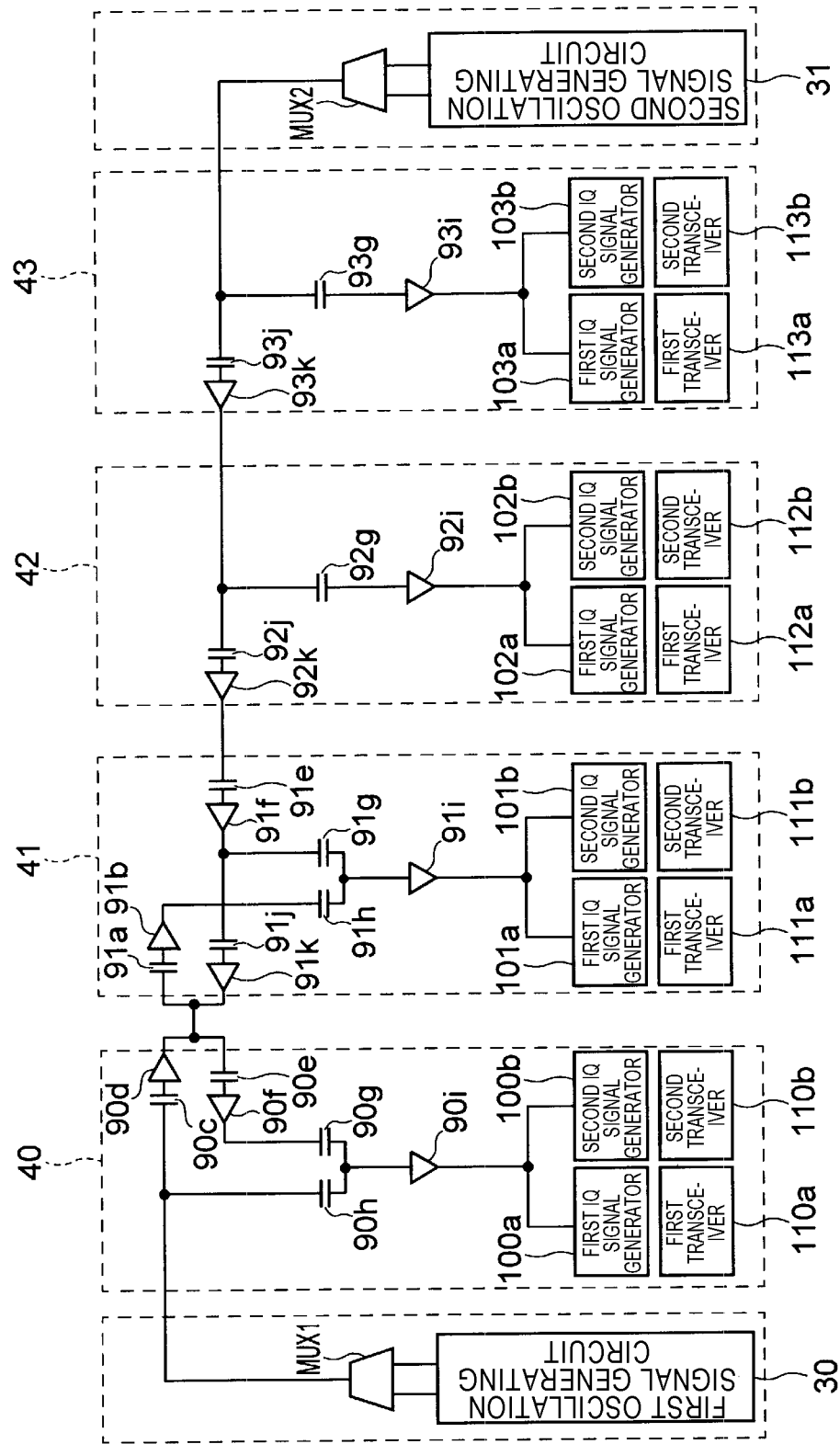
FIG. 16 is a diagram illustrating a modification of the semiconductor device according to the second embodiment and a diagram corresponding to FIG. 12.

Further, as illustrated in FIG. 16, in an alternative semiconductor device 1 according to the second embodiment, the first circuit unit 40 and the second circuit unit 41 are connected to each other by the 1-line transmissions path to transmit and receive the first oscillation signal or the second oscillation signal as with the first embodiment. As a result, the reduction of the circuit area may be further achieved.

In addition, in a modification as illustrated in FIG. 17, power is not supplied to the selection circuit MUX1 from the power supply system of the same power supply circuit 20 as the first oscillation signal generating circuit 30, but the power is supplied to the selection circuit MUX1 from the power supply system of the same power supply circuit 21 as the first circuit unit 40. Similarly, power is not supplied to the selection circuit MUX2 from the power supply system of the same power supply circuit 25 as the second oscillation signal generating circuit 31, but the power is be supplied to the selection circuit MUX2 from the power supply system of the same power supply circuit 24 as the fourth circuit unit 43.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first circuit unit, comprising a first buffer, a second buffer, and a first processing unit, connected to a first power supply system;
a second circuit unit, comprising a third buffer, connected to a second power supply system different from the first power supply system;
a first oscillation signal generating circuit connected to the first power supply system; and
a second oscillation signal generating circuit connected to the second power supply system,
wherein a first oscillation signal generated by the first oscillation signal generating circuit is input to the first buffer,
wherein a second oscillation signal generated by the second oscillation signal generating circuit is input to the second buffer through the third buffer, and
wherein the first buffer selectively outputs the input first oscillation signal and the second buffer selectively outputs the input second oscillation signal based on a value of a control signal.

2. The semiconductor device according to claim 1,
wherein the second circuit unit further comprises a fourth buffer and a second processing unit,
wherein the first oscillation signal is input into the fourth buffer through the first buffer, and
wherein the fourth buffer selectively outputs the input first oscillation signal to the second processing unit based on a value of the control signal.

3. The semiconductor device according to claim 2, further comprising a common connection between the first buffer, the second buffer, the third buffer, and the fourth buffer.

4. The semiconductor device according to claim 2,
wherein a first connection is between the first buffer and the third buffer and a second connection path is between the second buffer and the fourth buffer, separately from the first connection.

5. The semiconductor device according to claim 2, further comprising:
a fifth buffer into which the first oscillation signal is input,
wherein the fifth buffer selectively outputs the input first oscillation signal to the first processing unit and the first buffer based on a value of the control signal.

6. The semiconductor device according to claim 5,
wherein the fifth buffer is provided in the first circuit unit and is connected to the first power supply system.

7. The semiconductor device according to claim 1,
wherein the first oscillation signal generating circuit generates the first oscillation signal and the second oscillation signal, and
wherein the semiconductor device further comprises a first selection circuit configured to select the outputting of the first oscillation signal generated by the first oscillation signal generating circuit or the second oscillation signal generated by the first oscillation signal generating circuit.

8. The semiconductor device according to claim 7,
wherein the second oscillation signal generating circuit generates the first oscillation signal and the second oscillation signal, and
wherein the semiconductor device further comprises:
a second selection circuit configured to select the output of the first oscillation signal generated by the second oscillation signal generating circuit or the second oscillation signal generated by the second oscillation signal generating circuit,
a third circuit unit connected to a third power supply system different from the first and second power supply systems, and
a fourth circuit unit connected to a fourth power supply system different from the first to third power supply systems, and
wherein the fourth circuit unit comprises:
a sixth buffer connected to the fourth power supply system, wherein the first oscillation signal or the second oscillation signal output from the second selection circuit is input to the sixth buffer and the sixth buffer non-selectively outputs the second oscillation signal to the third circuit unit.

9. The semiconductor device according to claim 8,
wherein the third circuit unit comprises:
a seventh buffer connected to the third power supply system, wherein the first oscillation signal or the second oscillation signal output from the sixth buffer is input into the seventh buffer and the seventh buffer selectively outputs the input first oscillation signal or second oscillation signal to the second circuit unit.

10. The semiconductor device according to claim 9,
wherein the first oscillation signal and the second oscillation signal generated by the first oscillation signal generating circuit are not input into the third circuit unit and the fourth circuit unit.

11. The semiconductor device according to claim 8,
wherein the same power supply system is connected to the first oscillation signal generating circuit and to the first selection circuit, and
wherein the same power supply system is connected to the second oscillation signal generating circuit and to the second selection circuit.

12. A semiconductor device, comprising:
a first signal generator capable of generating an output signal at a first frequency;
a second signal generator capable of generating an output signal at a second frequency;
a first circuit unit connected to a first power source; and
a second circuit unit connected to a second power source, the second circuit unit connected to the first circuit unit and the second signal generator, and the first circuit unit connected to the second circuit unit and the first signal generator, wherein
the first circuit unit comprises a first switch and a second switch, the first and second switches switchable between a signal passing mode wherein a signal input thereto will pass through the switch, and a signal blocking mode wherein a signal input thereto will not pass through the switch,
the second circuit unit comprises a third switch and a fourth switch, the third and fourth switches switchable between a signal passing mode wherein a signal input thereto will pass through the switch, and a signal blocking mode wherein a signal input thereto will not pass through the switch, and
the first switch is connected to the third switch and the second switch is connected to the fourth switch.

13. The semiconductor device of claim 12, wherein each of the first, second, third, and fourth switches comprise buffers.

14. The semiconductor device of claim 12,
wherein the first circuit further comprises a fifth switch switchable between a signal passing mode wherein a signal input thereto will pass through the switch, and a signal blocking mode wherein a signal input thereto will not pass through the switch, and
wherein the fifth switch is connected to the first signal generator and the first switch.

15. The semiconductor device of claim 12,
wherein the second circuit further comprises a sixth switch switchable between a signal passing mode wherein a signal input thereto will pass through the switch, and a signal blocking mode wherein a signal input thereto will not pass through the switch, and
wherein the sixth switch is connected to the second signal generator and the fourth switch.

16. The semiconductor device of claim 12,
wherein the first, second, third, and fourth switches are connected to a common node, and
wherein at least one of the first or the second signal generators is capable of generating a signal at the first frequency and the second frequency.

17. A method of isolating a first signal having a first frequency from a second signal having a second frequency, comprising:
providing a first signal generator capable of generating a first signal at the first frequency;
providing a second signal generator capable of generating a second signal at the second frequency;
providing a first circuit unit connected to a first power source;
providing a second circuit unit connected to a second power source, the second circuit unit connected to the first circuit unit and the second signal generator, and the first circuit unit connected to the second circuit unit and the first signal generator;
providing, for the first circuit unit, a first switch and a second switch, the first and second switches switchable between a signal passing mode wherein a signal input thereto will pass through the switch, and a signal blocking mode wherein a signal input thereto will not pass through the switch;
providing, for the second circuit unit, a third switch and a fourth switch, the third and fourth switches switchable between a signal passing mode wherein a signal input thereto will pass through the switch, and a signal blocking mode wherein a signal input thereto will not pass through the switch;
connecting the first switch to the third switch and connecting the second switch to the fourth switch;
setting the first, second, third, and fourth switches in the signal blocking mode to provide the first signal to the first circuit unit and not to the second circuit unit; and
setting the first and third switches in the signal passing mode and the second and fourth switches in the signal blocking mode to provide the first signal to the first circuit unit and to the second circuit unit.

18. The method of claim 17, further comprising connecting the first, second, third, and fourth switches to a common node.

19. The method of claim 17, further comprising:
providing a fifth switch in the first circuit unit, connected between the first signal generator and the first switch;
providing a sixth switch in the second circuit unit, connected between the second signal generator and the fourth switch, wherein the fifth and sixth switches are switchable between a signal passing mode wherein a signal input thereto will pass through the switch, and a signal blocking mode wherein a signal input thereto will not pass through the switch; and
setting the sixth switch in the signal blocking mode when the first and third switches are set in the signal passing mode and the second and fourth switches are set in the signal blocking mode to provide the first signal to the first circuit unit and to the second circuit unit.

20. The method of claim 19, further comprising:
generating a signal at the first and the second frequency in at least one of the first and the second signal generators; and
selecting one of the first and the second frequencies to be output from the generator.

* * * * *